United States Patent
Zhao et al.

(10) Patent No.: US 10,014,387 B2
(45) Date of Patent: Jul. 3, 2018

(54) SEMICONDUCTOR STRUCTURE WITH MULTIPLE TRANSISTORS HAVING VARIOUS THRESHOLD VOLTAGES

(71) Applicant: Mie Fujitsu Semiconductor Limited, Kuwana (JP)

(72) Inventors: Dalong Zhao, San Jose, CA (US); Teymur Bakhishev, San Jose, CA (US); Lance Scudder, Sunnyvale, CA (US); Paul E. Gregory, Palo Alto, CA (US); Michael Duane, San Carlos, CA (US); U. C. Sridharan, San Jose, CA (US); Pushkar Ranade, Los Gatos, CA (US); Lucian Shifren, San Jose, CA (US); Thomas Hoffmann, Los Gatos, CA (US)

(73) Assignee: MIE FUJITSU SEMICONDUCTOR LIMITED, Kuwana (JP)

(*) Notice: Subject to any disclaimer, the term of this patent is extended or adjusted under 35 U.S.C. 154(b) by 0 days.

(21) Appl. No.: 15/047,052

(22) Filed: Feb. 18, 2016

(65) Prior Publication Data
US 2016/0163823 A1    Jun. 9, 2016

Related U.S. Application Data

(62) Division of application No. 13/926,555, filed on Jun. 25, 2013, now Pat. No. 9,299,698.
(Continued)

(51) Int. Cl.
*H01L 29/66* (2006.01)
*H01L 27/088* (2006.01)
(Continued)

(52) U.S. Cl.
CPC ........ *H01L 29/66537* (2013.01); *H01L 21/823412* (2013.01); *H01L 21/823493* (2013.01);
(Continued)

(58) Field of Classification Search
CPC ........ H01L 21/823412; H01L 21/823493
(Continued)

(56) References Cited

U.S. PATENT DOCUMENTS 3,958,266 A    5/1976  Athanas
4,000,504 A   12/1976  Berger
(Continued)

FOREIGN PATENT DOCUMENTS

EP    0274278    7/1988
EP    0312237    4/1989
(Continued)

OTHER PUBLICATIONS

Abiko, H et al., "A Channel Engineering Combined with Channel Epitaxy Optimization and TED Suppression for 0.15 μm n-n Gate CMOS Technology", 1995 Symposium on VLSI Technology Digest of Technical Papers, pp. 23-24.
(Continued)

*Primary Examiner* — Bo Fan
(74) *Attorney, Agent, or Firm* — Baker Botts L.L.P.

(57) ABSTRACT

A semiconductor structure includes first, second, and third transistor elements each having a first screening region concurrently formed therein. A second screening region is formed in the second and third transistor elements such that there is at least one characteristic of the screening region in the second transistor element that is different than the second screening region in the third transistor element. Different characteristics include doping concentration and depth of implant. In addition, a different characteristic may be
(Continued)

achieved by concurrently implanting the second screening region in the second and third transistor element followed by implanting an additional dopant into the second screening region of the third transistor element.

10 Claims, 16 Drawing Sheets

Related U.S. Application Data

(60) Provisional application No. 61/665,113, filed on Jun. 27, 2012.

(51) Int. Cl.
   *H01L 29/10* (2006.01)
   *H01L 21/8234* (2006.01)
(52) U.S. Cl.
   CPC .......... *H01L 27/088* (2013.01); *H01L 29/105* (2013.01); *H01L 29/1083* (2013.01); *H01L 29/66477* (2013.01)
(58) Field of Classification Search
   USPC ........................................ 438/276, 391, 402
   See application file for complete search history.

(56) References Cited

U.S. PATENT DOCUMENTS

| | | |
|---|---|---|
| 4,021,835 A | 5/1977 | Etoh |
| 4,242,691 A | 12/1980 | Kotani |
| 4,276,095 A | 6/1981 | Beilstein, Jr. |
| 4,315,781 A | 2/1982 | Henderson |
| 4,518,926 A | 5/1985 | Swanson |
| 4,559,091 A | 12/1985 | Allen |
| 4,578,128 A | 3/1986 | Mundt |
| 4,617,066 A | 10/1986 | Vasudev |
| 4,662,061 A | 5/1987 | Malhi |
| 4,761,384 A | 8/1988 | Neppl |
| 4,780,748 A | 10/1988 | Cunningham |
| 4,819,043 A | 4/1989 | Yazawa |
| 4,885,477 A | 12/1989 | Bird |
| 4,908,681 A | 3/1990 | Nishida |
| 4,945,254 A | 7/1990 | Robbins |
| 4,956,311 A | 9/1990 | Liou |
| 5,034,337 A | 7/1991 | Mosher |
| 5,144,378 A | 9/1992 | Hikosaka |
| 5,156,989 A | 10/1992 | Williams |
| 5,156,990 A | 10/1992 | Mitchell |
| 5,166,765 A | 11/1992 | Lee |
| 5,208,473 A | 5/1993 | Komori |
| 5,294,821 A | 3/1994 | Iwamatsu |
| 5,298,763 A | 3/1994 | Shen |
| 5,369,288 A | 11/1994 | Usuki |
| 5,373,186 A | 12/1994 | Schubert |
| 5,384,476 A | 1/1995 | Nishizawa |
| 5,426,328 A | 6/1995 | Yilmaz |
| 5,444,008 A | 8/1995 | Han |
| 5,552,332 A | 9/1996 | Tseng |
| 5,559,368 A | 9/1996 | Hu |
| 5,608,253 A | 3/1997 | Liu |
| 5,622,880 A | 4/1997 | Burr |
| 5,624,863 A | 4/1997 | Helm |
| 5,625,568 A | 4/1997 | Edwards |
| 5,641,980 A | 6/1997 | Yamaguchi |
| 5,663,583 A | 9/1997 | Matloubian |
| 5,712,501 A | 1/1998 | Davies |
| 5,719,422 A | 2/1998 | Burr |
| 5,726,488 A | 3/1998 | Watanabe |
| 5,726,562 A | 3/1998 | Mizuno |
| 5,731,626 A | 3/1998 | Eaglesham |
| 5,736,419 A | 4/1998 | Naem |
| 5,753,555 A | 5/1998 | Hada |
| 5,754,826 A | 5/1998 | Gamal |
| 5,756,365 A | 5/1998 | Kakumu |
| 5,763,921 A | 6/1998 | Okumura |
| 5,780,899 A | 7/1998 | Hu |
| 5,847,419 A | 12/1998 | Imai |
| 5,856,003 A | 1/1999 | Chiu |
| 5,861,334 A | 1/1999 | Rho |
| 5,864,163 A | 1/1999 | Chou |
| 5,877,049 A | 3/1999 | Liu |
| 5,885,876 A | 3/1999 | Dennen |
| 5,889,315 A | 3/1999 | Farrenkopf |
| 5,895,954 A | 4/1999 | Yasumura |
| 5,899,714 A | 5/1999 | Farremkopf |
| 5,918,129 A | 6/1999 | Fulford, Jr. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin |
| 5,985,705 A | 11/1999 | Seliskar |
| 5,989,963 A | 11/1999 | Luning |
| 6,001,695 A | 12/1999 | Wu |
| 6,020,227 A | 2/2000 | Bulucea |
| 6,043,139 A | 3/2000 | Eaglesham |
| 6,060,345 A | 5/2000 | Hause |
| 6,060,364 A | 5/2000 | Maszara |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,588 A | 8/2000 | Draper |
| 6,096,611 A | 8/2000 | Wu |
| 6,103,562 A | 8/2000 | Son |
| 6,121,153 A | 9/2000 | Kikkawa |
| 6,147,383 A | 11/2000 | Kuroda |
| 6,153,920 A | 11/2000 | Grossmann |
| 6,157,073 A | 12/2000 | Lehongres |
| 6,175,582 B1 | 1/2001 | Naito |
| 6,184,112 B1 | 2/2001 | Maszara |
| 6,190,979 B1 | 2/2001 | Radens |
| 6,194,259 B1 | 2/2001 | Nayak |
| 6,198,157 B1 | 3/2001 | Ishida |
| 6,204,153 B1 | 3/2001 | Gardner |
| 6,218,892 B1 | 4/2001 | Soumyanath |
| 6,218,895 B1 | 4/2001 | De |
| 6,221,724 B1 | 4/2001 | Yu |
| 6,229,188 B1 | 5/2001 | Aoki |
| 6,232,164 B1 | 5/2001 | Tsai |
| 6,235,597 B1 | 5/2001 | Miles |
| 6,245,618 B1 | 6/2001 | An |
| 6,268,640 B1 | 7/2001 | Park |
| 6,271,070 B2 | 8/2001 | Kotani |
| 6,271,551 B1 | 8/2001 | Schmitz |
| 6,288,429 B1 | 9/2001 | Iwata |
| 6,297,132 B1 | 10/2001 | Zhang |
| 6,300,177 B1 | 10/2001 | Sundaresan |
| 6,313,489 B1 | 11/2001 | Letavic |
| 6,319,799 B1 | 11/2001 | Ouyang |
| 6,320,222 B1 | 11/2001 | Forbes |
| 6,323,525 B1 | 11/2001 | Noguchi |
| 6,326,666 B1 | 12/2001 | Bernstein |
| 6,335,233 B1 | 1/2002 | Cho |
| 6,342,413 B1 | 1/2002 | Masuoka |
| 6,358,806 B1 | 3/2002 | Puchner |
| 6,380,019 B1 | 4/2002 | Yu |
| 6,391,752 B1 | 5/2002 | Colinge |
| 6,417,038 B1 | 7/2002 | Noda |
| 6,426,260 B1 | 7/2002 | Hshieh |
| 6,426,279 B1 | 7/2002 | Huster |
| 6,432,754 B1 | 8/2002 | Assaderaghi |
| 6,444,550 B1 | 9/2002 | Hao |
| 6,444,551 B1 | 9/2002 | Ku |
| 6,449,749 B1 | 9/2002 | Stine |
| 6,461,920 B1 | 10/2002 | Shirahata |
| 6,461,928 B2 | 10/2002 | Rodder |
| 6,469,347 B1 | 10/2002 | Oda |
| 6,472,278 B1 | 10/2002 | Marshall |
| 6,482,714 B1 | 11/2002 | Hieda |
| 6,489,224 B1 | 12/2002 | Burr |

(56) References Cited

U.S. PATENT DOCUMENTS

| | | | |
|---|---|---|---|
| 6,492,232 | B1 | 12/2002 | Tang |
| 6,500,739 | B1 | 12/2002 | Wang |
| 6,503,801 | B1 | 1/2003 | Rouse |
| 6,503,805 | B2 | 1/2003 | Wang |
| 6,506,640 | B1 | 1/2003 | Ishida |
| 6,518,623 | B1 | 2/2003 | Oda |
| 6,521,470 | B1 | 2/2003 | Lin |
| 6,534,373 | B1 | 3/2003 | Yu |
| 6,541,328 | B2 | 4/2003 | Whang |
| 6,541,829 | B2 | 4/2003 | Nishinohara |
| 6,548,842 | B1 | 4/2003 | Bulucea |
| 6,551,885 | B1 | 4/2003 | Yu |
| 6,552,377 | B1 | 4/2003 | Yu |
| 6,573,129 | B2 | 6/2003 | Hoke |
| 6,576,535 | B2 | 6/2003 | Drobny |
| 6,600,200 | B1 | 7/2003 | Lustig |
| 6,620,671 | B1 | 9/2003 | Wang |
| 6,624,488 | B1 | 9/2003 | Kim |
| 6,627,473 | B1 | 9/2003 | Oikawa |
| 6,630,710 | B1 | 10/2003 | Augusto |
| 6,660,605 | B1 | 12/2003 | Liu |
| 6,662,350 | B2 | 12/2003 | Fried |
| 6,667,200 | B2 | 12/2003 | Sohn |
| 6,670,260 | B1 | 12/2003 | Yu |
| 6,693,333 | B1 | 2/2004 | Yu |
| 6,730,568 | B2 | 5/2004 | Sohn |
| 6,737,724 | B2 | 5/2004 | Hieda |
| 6,743,291 | B2 | 6/2004 | Ang |
| 6,743,684 | B2 | 6/2004 | Liu |
| 6,751,519 | B1 | 6/2004 | Satya |
| 6,753,230 | B2 | 6/2004 | Sohn |
| 6,760,900 | B2 | 7/2004 | Rategh |
| 6,770,944 | B2 | 8/2004 | Nishinohara |
| 6,787,424 | B1 | 9/2004 | Yu |
| 6,797,553 | B2 | 9/2004 | Adkisson |
| 6,797,602 | B1 | 9/2004 | Kluth |
| 6,797,994 | B1 | 9/2004 | Hoke |
| 6,808,004 | B2 | 10/2004 | Kamm |
| 6,808,994 | B1 | 10/2004 | Wang |
| 6,813,750 | B2 | 11/2004 | Usami |
| 6,821,825 | B2 | 11/2004 | Todd |
| 6,821,852 | B2 | 11/2004 | Rhodes |
| 6,822,297 | B2 | 11/2004 | Nandakumar |
| 6,831,292 | B2 | 12/2004 | Currie |
| 6,835,639 | B2 | 12/2004 | Rotondaro |
| 6,852,602 | B2 | 2/2005 | Kanzawa |
| 6,852,603 | B2 | 2/2005 | Chakravarthi |
| 6,881,641 | B2 | 4/2005 | Wieczorek |
| 6,881,987 | B2 | 4/2005 | Sohn |
| 6,891,439 | B2 | 5/2005 | Jachne |
| 6,893,947 | B2 | 5/2005 | Martinez |
| 6,900,519 | B2 | 5/2005 | Cantell |
| 6,901,564 | B2 | 5/2005 | Stine |
| 6,916,698 | B2 | 7/2005 | Mocuta |
| 6,917,237 | B1 | 7/2005 | Tschanz |
| 6,927,463 | B2 | 8/2005 | Iwata |
| 6,928,128 | B1 | 8/2005 | Sidiropoulos |
| 6,930,007 | B2 | 8/2005 | Bu |
| 6,930,360 | B2 | 8/2005 | Yamauchi |
| 6,957,163 | B2 | 10/2005 | Ando |
| 6,963,090 | B2 | 11/2005 | Passlack |
| 6,995,397 | B1 | 2/2006 | Yamashita |
| 7,002,214 | B1 | 2/2006 | Boyd |
| 7,008,836 | B2 | 3/2006 | Algotsson |
| 7,013,359 | B1 | 3/2006 | Li |
| 7,015,546 | B2 | 3/2006 | Herr |
| 7,015,741 | B2 | 3/2006 | Tschanz |
| 7,022,559 | B2 | 4/2006 | Barnak |
| 7,036,098 | B2 | 4/2006 | Eleyan |
| 7,038,258 | B2 | 5/2006 | Liu |
| 7,039,881 | B2 | 5/2006 | Regan |
| 7,042,051 | B2 | 5/2006 | Ootsuka |
| 7,045,456 | B2 | 5/2006 | Murto |
| 7,057,216 | B2 | 6/2006 | Ouyang |
| 7,061,058 | B2 | 6/2006 | Chakravarthi |
| 7,064,039 | B2 | 6/2006 | Liu |
| 7,064,399 | B2 | 6/2006 | Babcock |
| 7,071,103 | B2 | 7/2006 | Chan |
| 7,078,325 | B2 | 7/2006 | Curello |
| 7,078,776 | B2 | 7/2006 | Nishinohara |
| 7,089,513 | B2 | 8/2006 | Bard |
| 7,089,515 | B2 | 8/2006 | Hanafi |
| 7,091,093 | B1 | 8/2006 | Noda |
| 7,105,399 | B1 | 9/2006 | Dakshina-Murthy |
| 7,109,099 | B2 | 9/2006 | Tan |
| 7,119,381 | B2 | 10/2006 | Passlack |
| 7,122,411 | B2 | 10/2006 | Mouli |
| 7,127,687 | B1 | 10/2006 | Signore |
| 7,132,323 | B2 | 11/2006 | Haensch |
| 7,169,675 | B2 | 1/2007 | Tan |
| 7,170,120 | B2 | 1/2007 | Datta |
| 7,176,137 | B2 | 2/2007 | Perng |
| 7,186,598 | B2 | 3/2007 | Yamauchi |
| 7,189,627 | B2 | 3/2007 | Wu |
| 7,199,430 | B2 | 4/2007 | Babcock |
| 7,202,517 | B2 | 4/2007 | Dixit |
| 7,208,354 | B2 | 4/2007 | Bauer |
| 7,211,871 | B2 | 5/2007 | Cho |
| 7,221,021 | B2 | 5/2007 | Wu |
| 7,223,646 | B2 | 5/2007 | Miyashita |
| 7,226,833 | B2 | 6/2007 | White |
| 7,226,843 | B2 | 6/2007 | Weber |
| 7,230,680 | B2 | 6/2007 | Fujisawa |
| 7,235,822 | B2 | 6/2007 | Li |
| 7,256,639 | B1 | 8/2007 | Koniaris |
| 7,259,428 | B2 | 8/2007 | Inaba |
| 7,260,562 | B2 | 8/2007 | Czajkowski |
| 7,294,877 | B2 | 11/2007 | Rueckes |
| 7,297,994 | B2 | 11/2007 | Wieczorek |
| 7,301,208 | B2 | 11/2007 | Handa |
| 7,304,350 | B2 | 12/2007 | Misaki |
| 7,307,471 | B2 | 12/2007 | Gammie |
| 7,312,500 | B2 | 12/2007 | Miyashita |
| 7,323,754 | B2 * | 1/2008 | Ema ............... H01L 21/823412 257/391 |
| 7,332,439 | B2 | 2/2008 | Lindert |
| 7,348,629 | B2 | 3/2008 | Chu |
| 7,354,833 | B2 | 4/2008 | Liaw |
| 7,380,225 | B2 | 5/2008 | Joshi |
| 7,398,497 | B2 | 7/2008 | Sato |
| 7,402,207 | B1 | 7/2008 | Besser |
| 7,402,872 | B2 | 7/2008 | Murthy |
| 7,416,605 | B2 | 8/2008 | Zollner |
| 7,427,788 | B2 | 9/2008 | Li |
| 7,442,971 | B2 | 10/2008 | Wirbeleit |
| 7,449,733 | B2 | 11/2008 | Inaba |
| 7,462,908 | B2 | 12/2008 | Bol |
| 7,469,164 | B2 | 12/2008 | Du-Nour |
| 7,470,593 | B2 | 12/2008 | Rouh |
| 7,485,536 | B2 | 2/2009 | Jin |
| 7,487,474 | B2 | 2/2009 | Ciplickas |
| 7,491,988 | B2 | 2/2009 | Tolchinsky |
| 7,494,861 | B2 | 2/2009 | Chu |
| 7,496,862 | B2 | 2/2009 | Chang |
| 7,496,867 | B2 | 2/2009 | Turner |
| 7,498,637 | B2 | 3/2009 | Yamaoka |
| 7,501,324 | B2 | 3/2009 | Babcock |
| 7,503,020 | B2 | 3/2009 | Allen |
| 7,507,999 | B2 | 3/2009 | Kusumoto |
| 7,514,766 | B2 | 4/2009 | Yoshida |
| 7,521,323 | B2 | 4/2009 | Surdeanu |
| 7,531,393 | B2 | 5/2009 | Doyle |
| 7,531,836 | B2 | 5/2009 | Liu |
| 7,538,364 | B2 | 5/2009 | Twynam |
| 7,538,412 | B2 | 5/2009 | Schulze |
| 7,562,233 | B1 | 7/2009 | Sheng |
| 7,564,105 | B2 | 7/2009 | Chi |
| 7,566,600 | B2 | 7/2009 | Mouli |
| 7,569,456 | B2 | 8/2009 | Ko |
| 7,586,322 | B1 | 9/2009 | Xu |
| 7,592,241 | B2 * | 9/2009 | Takao ............ H01L 21/823807 257/402 |
| 7,595,243 | B1 | 9/2009 | Bulucea |
| 7,598,142 | B2 | 10/2009 | Ranade |

(56) References Cited

U.S. PATENT DOCUMENTS

| | | |
|---|---|---|
| 7,605,041 B2 | 10/2009 | Ema |
| 7,605,060 B2 | 10/2009 | Meunier-Beillard |
| 7,605,429 B2 | 10/2009 | Bernstein |
| 7,608,496 B2 | 10/2009 | Chu |
| 7,615,802 B2 | 11/2009 | Elpelt |
| 7,622,341 B2 | 11/2009 | Chudzik |
| 7,638,380 B2 | 12/2009 | Pearce |
| 7,642,140 B2 | 1/2010 | Bae |
| 7,644,377 B1 | 1/2010 | Saxe |
| 7,645,665 B2 | 1/2010 | Kubo |
| 7,651,920 B2 | 1/2010 | Siprak |
| 7,655,523 B2 | 2/2010 | Babcock |
| 7,673,273 B2 | 3/2010 | Madurawe |
| 7,675,126 B2 | 3/2010 | Cho |
| 7,675,317 B2 | 3/2010 | Perisetty |
| 7,678,638 B2 | 3/2010 | Chu |
| 7,681,628 B2 | 3/2010 | Joshi |
| 7,682,887 B2 | 3/2010 | Dokumaci |
| 7,683,442 B1 | 3/2010 | Burr |
| 7,696,000 B2 | 4/2010 | Liu |
| 7,704,822 B2 | 4/2010 | Jeong |
| 7,704,844 B2 | 4/2010 | Zhu |
| 7,709,828 B2 | 5/2010 | Braithwaite |
| 7,723,750 B2 | 5/2010 | Zhu |
| 7,737,472 B2 | 6/2010 | Kondo |
| 7,741,138 B2 | 6/2010 | Cho |
| 7,741,200 B2 | 6/2010 | Cho |
| 7,745,270 B2 | 6/2010 | Shah |
| 7,750,374 B2 | 7/2010 | Capasso |
| 7,750,381 B2 | 7/2010 | Hokazono |
| 7,750,405 B2 | 7/2010 | Nowak |
| 7,750,682 B2 | 7/2010 | Bernstein |
| 7,755,144 B2 | 7/2010 | Li |
| 7,755,146 B2 | 7/2010 | Helm |
| 7,759,206 B2 | 7/2010 | Luo |
| 7,759,714 B2 | 7/2010 | Itoh |
| 7,761,820 B2 | 7/2010 | Berger |
| 7,795,677 B2 | 9/2010 | Bangsaruntip |
| 7,808,045 B2 | 10/2010 | Kawahara |
| 7,808,410 B2 | 10/2010 | Kim |
| 7,811,873 B2 | 10/2010 | Mochizuki |
| 7,811,881 B2 | 10/2010 | Cheng |
| 7,818,702 B2 | 10/2010 | Mandelman |
| 7,821,066 B2 | 10/2010 | Lebby |
| 7,829,402 B2 | 11/2010 | Matocha |
| 7,831,873 B1 | 11/2010 | Trimberger |
| 7,846,822 B2 | 12/2010 | Seebauer |
| 7,855,118 B2 | 12/2010 | Hoentschel |
| 7,859,013 B2 | 12/2010 | Chen |
| 7,863,163 B2 | 1/2011 | Bauer |
| 7,867,835 B2 | 1/2011 | Lee |
| 7,883,977 B2 | 2/2011 | Babcock |
| 7,888,205 B2 | 2/2011 | Herner |
| 7,888,747 B2 | 2/2011 | Hokazono |
| 7,895,546 B2 | 2/2011 | Lahner |
| 7,897,495 B2 | 3/2011 | Ye |
| 7,906,413 B2 | 3/2011 | Cardone |
| 7,906,813 B2 | 3/2011 | Kato |
| 7,910,419 B2 | 3/2011 | Fenouillet-Beranger |
| 7,919,791 B2 | 4/2011 | Flynn |
| 7,926,018 B2 | 4/2011 | Moroz |
| 7,935,984 B2 | 5/2011 | Nakano |
| 7,941,776 B2 | 5/2011 | Majumder |
| 7,945,800 B2 | 5/2011 | Gomm |
| 7,948,008 B2 | 5/2011 | Liu |
| 7,952,147 B2 | 5/2011 | Ueno |
| 7,960,232 B2 | 6/2011 | King |
| 7,960,238 B2 | 6/2011 | Kohli |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell |
| 7,989,900 B2 | 8/2011 | Haensch |
| 7,994,573 B2 | 8/2011 | Pan |
| 8,004,024 B2 | 8/2011 | Furukawa |
| 8,012,827 B2 | 9/2011 | Yu |
| 8,029,620 B2 | 10/2011 | Kim |
| 8,039,332 B2 | 10/2011 | Bernard |
| 8,046,598 B2 | 10/2011 | Lee |
| 8,048,791 B2 | 11/2011 | Hargrove |
| 8,048,810 B2 | 11/2011 | Tsai |
| 8,051,340 B2 | 11/2011 | Cranford, Jr. |
| 8,053,340 B2 | 11/2011 | Colombeau |
| 8,063,466 B2 | 11/2011 | Kurita |
| 8,067,279 B2 | 11/2011 | Sadra |
| 8,067,280 B2 | 11/2011 | Wang |
| 8,067,302 B2 | 11/2011 | Li |
| 8,076,719 B2 | 12/2011 | Zeng |
| 8,097,529 B2 | 1/2012 | Krull |
| 8,103,983 B2 | 1/2012 | Agarwal |
| 8,105,891 B2 | 1/2012 | Yeh |
| 8,106,424 B2 | 1/2012 | Schruefer |
| 8,106,481 B2 | 1/2012 | Rao |
| 8,110,487 B2 | 2/2012 | Griebenow |
| 8,114,761 B2 | 2/2012 | Mandrekar |
| 8,119,482 B2 | 2/2012 | Bhalla |
| 8,120,069 B2 | 2/2012 | Hynecek |
| 8,129,246 B2 | 3/2012 | Babcock |
| 8,129,797 B2 | 3/2012 | Chen |
| 8,134,159 B2 | 3/2012 | Hokazono |
| 8,143,120 B2 | 3/2012 | Kerr |
| 8,143,124 B2 | 3/2012 | Challa |
| 8,143,678 B2 | 3/2012 | Kim |
| 8,148,774 B2 | 4/2012 | Mori |
| 8,163,619 B2 | 4/2012 | Yang |
| 8,169,002 B2 | 5/2012 | Chang |
| 8,170,857 B2 | 5/2012 | Joshi |
| 8,173,499 B2 | 5/2012 | Chung |
| 8,173,502 B2 | 5/2012 | Yan |
| 8,176,461 B1 | 5/2012 | Trimberger |
| 8,178,430 B2 | 5/2012 | Kim |
| 8,179,530 B2 | 5/2012 | Levy |
| 8,183,096 B2 | 5/2012 | Wirbeleit |
| 8,183,107 B2 | 5/2012 | Mathur |
| 8,185,865 B2 | 5/2012 | Gupta |
| 8,187,959 B2 | 5/2012 | Pawlak |
| 8,188,542 B2 | 5/2012 | Yoo |
| 8,196,545 B2 | 6/2012 | Kurosawa |
| 8,201,122 B2 | 6/2012 | Dewey, III |
| 8,214,190 B2 | 7/2012 | Joshi |
| 8,217,423 B2 | 7/2012 | Liu |
| 8,225,255 B2 | 7/2012 | Ouyang |
| 8,227,307 B2 | 7/2012 | Chen |
| 8,236,661 B2 | 8/2012 | Dennard |
| 8,239,803 B2 | 8/2012 | Kobayashi |
| 8,247,300 B2 | 8/2012 | Babcock |
| 8,255,843 B2 | 8/2012 | Chen |
| 8,258,026 B2 | 9/2012 | Bulucea |
| 8,266,567 B2 | 9/2012 | El Yahyaoui |
| 8,286,180 B2 | 10/2012 | Foo |
| 8,288,798 B2 | 10/2012 | Passlack |
| 8,299,562 B2 | 10/2012 | Li |
| 8,324,059 B2 | 12/2012 | Guo |
| 2001/0014495 A1 | 8/2001 | Yu |
| 2002/0033511 A1 | 3/2002 | Babcock |
| 2002/0042184 A1 | 4/2002 | Nandakumar |
| 2003/0006415 A1 | 1/2003 | Yokogawa |
| 2003/0047763 A1 | 3/2003 | Hieda |
| 2003/0122203 A1 | 7/2003 | Nishinohara |
| 2003/0173626 A1 | 9/2003 | Burr |
| 2003/0183856 A1 | 10/2003 | Wieczorek |
| 2003/0215992 A1 | 11/2003 | Sohn |
| 2004/0053457 A1 | 3/2004 | Sohn |
| 2004/0075118 A1 | 4/2004 | Heinemann |
| 2004/0075143 A1 | 4/2004 | Bae |
| 2004/0084731 A1 | 5/2004 | Matsuda |
| 2004/0087090 A1 | 5/2004 | Grudowski |
| 2004/0126947 A1 | 7/2004 | Sohn |
| 2004/0175893 A1 | 9/2004 | Vatus |
| 2004/0180488 A1 | 9/2004 | Lee |
| 2005/0056877 A1 | 3/2005 | Rueckes |
| 2005/0106824 A1 | 5/2005 | Alberto |
| 2005/0116282 A1 | 6/2005 | Pattanayak |

(56) References Cited

U.S. PATENT DOCUMENTS

| | | |
|---|---|---|
| 2005/0214965 A1* | 9/2005 | Park .................. H01L 33/0079 438/33 |
| 2005/0250289 A1 | 11/2005 | Babcock |
| 2005/0280075 A1 | 12/2005 | Ema |
| 2006/0017100 A1 | 1/2006 | Bol |
| 2006/0022270 A1 | 2/2006 | Boyd |
| 2006/0049464 A1 | 3/2006 | Rao |
| 2006/0068555 A1 | 3/2006 | Huilong |
| 2006/0068586 A1 | 3/2006 | Pain |
| 2006/0071278 A1 | 4/2006 | Takao |
| 2006/0091481 A1 | 5/2006 | Li |
| 2006/0154428 A1 | 7/2006 | Dokumaci |
| 2006/0157794 A1 | 7/2006 | Doyle |
| 2006/0197158 A1 | 9/2006 | Babcock |
| 2006/0203581 A1 | 9/2006 | Joshi |
| 2006/0220114 A1 | 10/2006 | Miyashita |
| 2006/0223248 A1 | 10/2006 | Venugopal |
| 2007/0040222 A1 | 2/2007 | Van Camp |
| 2007/0117326 A1 | 5/2007 | Tan |
| 2007/0158790 A1 | 7/2007 | Rao |
| 2007/0212861 A1 | 9/2007 | Chidambarrao |
| 2007/0238253 A1 | 10/2007 | Tucker |
| 2008/0067589 A1 | 3/2008 | Ito |
| 2008/0108208 A1 | 5/2008 | Arevalo |
| 2008/0138953 A1 | 6/2008 | Challa |
| 2008/0169493 A1 | 7/2008 | Lee |
| 2008/0169516 A1 | 7/2008 | Chung |
| 2008/0197439 A1 | 8/2008 | Goerlach |
| 2008/0227250 A1 | 9/2008 | Ranade |
| 2008/0237661 A1 | 10/2008 | Ranade |
| 2008/0258198 A1 | 10/2008 | Bojarczuk |
| 2008/0272409 A1 | 11/2008 | Sonkale |
| 2009/0003105 A1 | 1/2009 | Itoh |
| 2009/0057746 A1 | 3/2009 | Sugll |
| 2009/0057762 A1 | 3/2009 | Bangsarontip |
| 2009/0108350 A1 | 4/2009 | Cai |
| 2009/0121298 A1 | 5/2009 | Furukawa |
| 2009/0134468 A1 | 5/2009 | Tsuchiya |
| 2009/0224319 A1 | 9/2009 | Kohli |
| 2009/0302388 A1 | 12/2009 | Cai |
| 2009/0309140 A1 | 12/2009 | Khamankar |
| 2009/0311837 A1 | 12/2009 | Kapoor |
| 2009/0321849 A1 | 12/2009 | Miyamura |
| 2010/0012988 A1 | 1/2010 | Yang |
| 2010/0038724 A1 | 2/2010 | Anderson |
| 2010/0100856 A1 | 4/2010 | Mittal |
| 2010/0148153 A1 | 6/2010 | Hudait |
| 2010/0149854 A1 | 6/2010 | Vora |
| 2010/0187641 A1 | 7/2010 | Zhu |
| 2010/0207182 A1 | 8/2010 | Paschal |
| 2010/0244152 A1* | 9/2010 | Bahl .................. H01L 21/26513 257/408 |
| 2010/0270600 A1 | 10/2010 | Inukai |
| 2011/0057294 A1* | 3/2011 | Arena .................. H01L 21/187 257/615 |
| 2011/0059588 A1 | 3/2011 | Kang |
| 2011/0073961 A1 | 3/2011 | Dennard |
| 2011/0074498 A1 | 3/2011 | Thompson |
| 2011/0079860 A1 | 4/2011 | Verhulst |
| 2011/0079861 A1 | 4/2011 | Shifren |
| 2011/0095811 A1 | 4/2011 | Chi |
| 2011/0121404 A1 | 5/2011 | Shifren |
| 2011/0147828 A1 | 6/2011 | Murthy |
| 2011/0169082 A1 | 7/2011 | Zhu |
| 2011/0175170 A1 | 7/2011 | Wang |
| 2011/0180880 A1 | 7/2011 | Chudzik |
| 2011/0193164 A1 | 8/2011 | Zhu |
| 2011/0212590 A1 | 9/2011 | Wu |
| 2011/0230039 A1 | 9/2011 | Mowry |
| 2011/0242921 A1 | 10/2011 | Tran |
| 2011/0248352 A1 | 10/2011 | Shifren |
| 2011/0294278 A1 | 12/2011 | Eguchi |
| 2011/0309447 A1 | 12/2011 | Arghavani |
| 2011/0309450 A1 | 12/2011 | Shifren |
| 2012/0021594 A1 | 1/2012 | Gurtej |
| 2012/0034745 A1 | 2/2012 | Colombeau |
| 2012/0056275 A1 | 3/2012 | Cai |
| 2012/0065920 A1 | 3/2012 | Nagumo |
| 2012/0100680 A1* | 4/2012 | Chuang ............ H01L 21/26593 438/234 |
| 2012/0108050 A1 | 5/2012 | Chen |
| 2012/0132998 A1 | 5/2012 | Kwon |
| 2012/0138953 A1 | 6/2012 | Cai |
| 2012/0146155 A1 | 6/2012 | Koentschel |
| 2012/0167025 A1 | 6/2012 | Gillespie |
| 2012/0187491 A1 | 7/2012 | Zhu |
| 2012/0190177 A1 | 7/2012 | Kim |
| 2012/0223363 A1 | 9/2012 | Kronholz |

FOREIGN PATENT DOCUMENTS

| | | |
|---|---|---|
| EP | 0531621 | 3/1993 |
| EP | 0683515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 794094 | 1/2008 |
| WO | WO2011/062788 | 5/2011 |

OTHER PUBLICATIONS

Chau, R et al., "A 50nm Depleted-Substrate CMOS Transistor (DST)", Electron Device Meeting 2001, IEDM Technical Digest, IEEE International, pp. 29.1.1-29.1.4.

Ducroquet, F et al. "Fully Depleted Silicon-On-Insulator nMOSFETs with Tensile Strained High Carbon Content $Si_{1-y}C_y$ Channel", ECS 210th Meeting, Abstract 1033, 2006.

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961.

Goesele, U et al., Diffusion Engineering by Carbon in Silicon, Mat. Res. Soc. Symp. vol. 610, 2000.

Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113.

Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.

Holland, OW and Thomas, DK "A Method to Improve Activation of Implanted Dopants in SiC", Oak Ridge National Laboratory, Oak Ridge, TN, 2001.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462, 1996.

Lavéant, P. "Incorporation, Diffusion and Agglomeration of Carbon in Silicon", Solid State Phenomena, vols. 82-84, pp. 189-194, 2002.

Noda, K et al., "A 0.1-μm Delta-Doped MOSFET Fabricated with Post-Low-Energy Implanting Selective Epitaxy" IEEE Transactions on Electron Devices, vol. 45, No. 4, pp. 809-814, Apr. 1998.

Ohguro, T et al., "An 0.18-μm CMOS for Mixed Digital and Analog Aplications with Zero-Volt-Vth Epitaxial-Channel MOSFET's", IEEE Transactions on Electron Devices, vol. 46, No. 7, pp. 1378-1383, Jul. 1999.

Pinacho, R et al., "Carbon in Silicon: Modeling of Diffusion and Clustering Mechanisms", Journal of Applied Physics, vol. 92, No. 3, pp. 1582-1588, Aug. 2002.

Robertson, LS et al., "The Effect of Impurities on Diffusion and Activation of Ion Implanted Boron in Silicon", Mat. Res. Soc. Symp. vol. 610, 2000.

Scholz, R et al., "Carbon-Induced Undersaturation of Silicon Self-Interstitials", Appl. Phys. Lett. 72(2), pp. 200-202, Jan. 1998.

(56) References Cited

OTHER PUBLICATIONS

Scholz, RF et al., "The Contribution of Vacancies to Carbon Out-Diffusion in Silicon", Appl. Phys. Lett., vol. 74, No. 3, pp. 392-394, Jan. 1999.
Stolk, PA et al., "Physical Mechanisms of Transient Enhanced Dopant Diffusion in Ion-Implanted Silicon", J. Appl. Phys. 81(9), pp. 6031-6050, May 1997.
Thompson, S et al., "MOS Scaling: Transistor Challenges for the 21st Century", Intel Technology Journal Q3 1998, pp. 1-19, 1998.
Wann, C. et al., "Channel Profile Optimization and Device Design for Low-Power High-Performance Dynamic-Threshold MOSFET", IEDM 96, pp. 113-116, 1996.
Werner, P et al., "Carbon Diffusion in Silicon", Applied Physics Letters, vol. 73, No. 17, pp. 2465-2467, Oct. 1998.
Yan, Ran-Hong et al., "Scaling the Si MOSFET: From Bulk to SOI to Bulk", IEEE Transactions on Electron Devices, vol. 39, No. 7, Jul. 1992.
Advanced Channel Engineering Achieving Aggressive Reduction of VT Variation for Ultra-Low-Power Applications; Electron Devices Meeting (IEDM11-749), 2011 IEEE International, Dec. 5, 2011 (Dec. 5, 2011), pp. 32.3.1-32.3.4—XP032096049A, ISBN: 978-1-4577-0506-9, Section "DDC Transistor Structure" (4 pgs).
PCT Notification of Transmittal of the Int'l Search Report and the Written Opinion of the Int'l Searching Authority, or the Declaration; Re: Intl. Appln. PCT/US2013/047767 dated Sep. 16, 2013 (Sep. 16, 2013); Int'l filing date Jun. 26, 2013 (Jun. 26, 2013); from foreign .0437 (13 pgs).
Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.
Samsudin, K et al., "Integrating Intrinsic Parameter Fluctuation Description into BSIMSOI to Forecast sub-15nm UTB SOI based 6T SRAM Operation", Solid-State Electronics (50), pp. 86-93, 2006.
Wong, H et al., "Nanoscale CMOS", Proceedings of the IEEE, Vo. 87, No. 4, pp. 537-570, Apr. 1999.
Stanley Wolf et al., Silicon Processing for the VLSI Era, 2000, Lattice Press, vol. 1, pp. 109-112.
Banerjee, et al. "Compensating Non-Optical Effects Using Electrically-Driven Optical Proximity Correction," Proc. of SPIE vol. 7275 7275OE, 2009.
Cheng, et al. "Extremely Thin SOI (ETSOI) CMOS with Record Low Variability for Low Power System-on-Chip Applications," Electron Devices Meeting (IEDM), Dec. 2009.
Cheng, et al. "Fully Depleted Extremely Thin SOI Technology Fabricated by a Novel Integration Scheme Featuring Implant-Free, Zero-Silicon-Loss, and Faceted Raised Source/Drain," Symposium on VLSI Technology Digest of Technical Papers, pp. 212-213, 2009.
Drennan, et al. "Implications of Proximity Effects for Analog Design," Custom Integrated Circuits Conferences, pp. 169-176, Sep. 2006.
Hook, et al. "Lateral Ion Implant Struggle and Mask Proximity Effect," IEEE Transactions on Electron Devices, vol. 50, No. 9, pp. 1946-1951, Sep. 2003.
Hori, et al. "A 0.1 µm CMOS with a Step Channel Profile Formed by Ultra High Vacuum CVD and In-Situ Doped Ions," Proceedings of the International Electron Devices Meeting, New York, IEEE, US, pp. 909-911, Dec. 5, 1993.
Matshuashi, et al. "High-Performance Double-Layer Epitaxial-Channel PMOSFET Compatible with a Single Gate CMOSFET," Symposium on VLSI Technology Digest of Technical Papers, pp. 36-37, 1996.
Shao, et al. "Boron Diffusion in Silicon: The Anomalies and Control by Point Defect Engineering," Materials Science and Engineering R: Reports, vol. 42, No. 3-4, pp. 65-114, Nov. 1, 2003.
Sheu, et al. "Modeling the Well-Edge Proximity Effect in Highly Scaled MOSFETs," IEEE Transactions on Electron Devices, vol. 53, No. 11, pp. 2791-2798, Nov. 2006.

\* cited by examiner

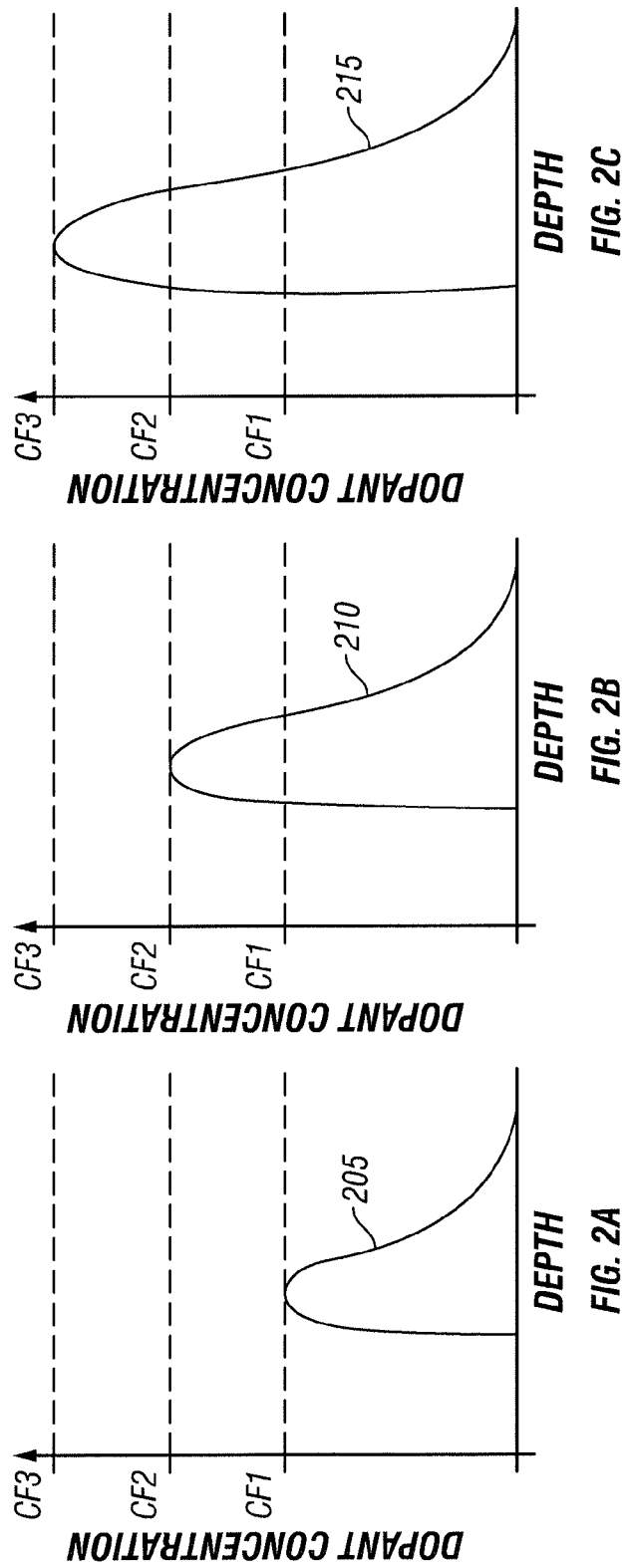

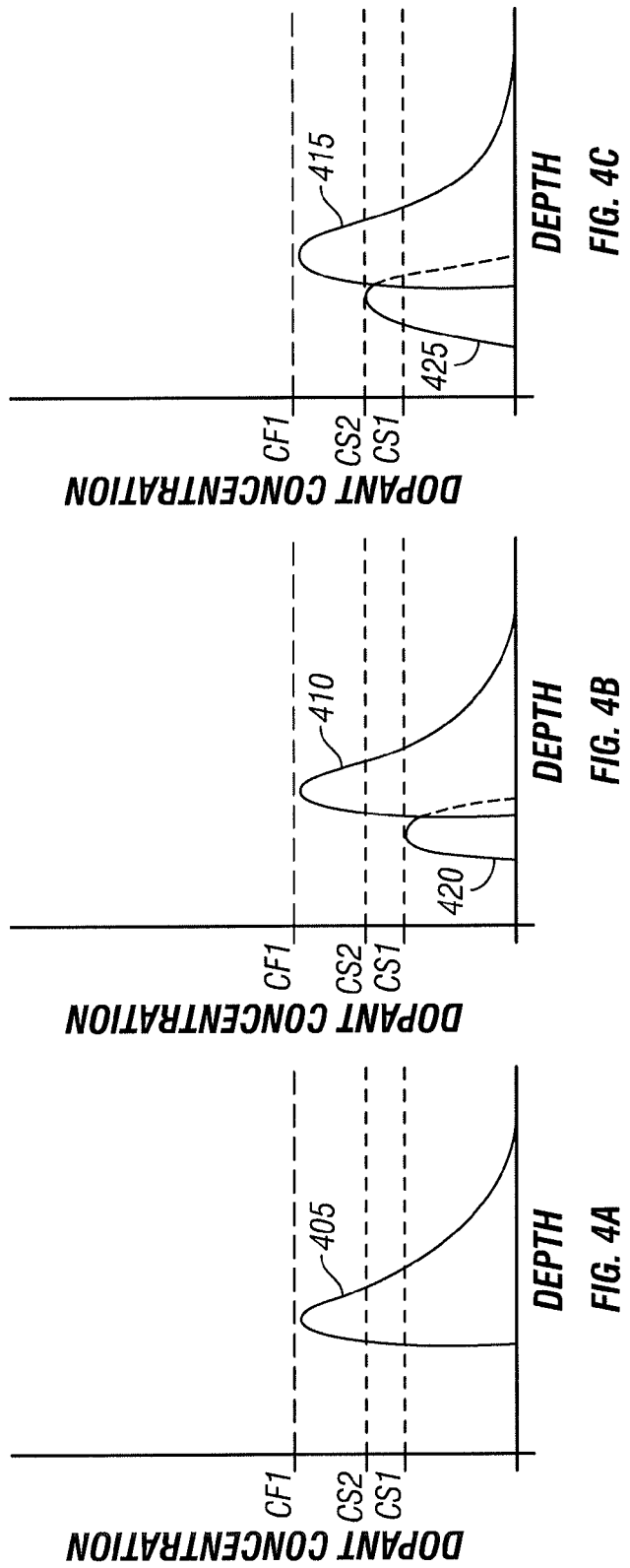

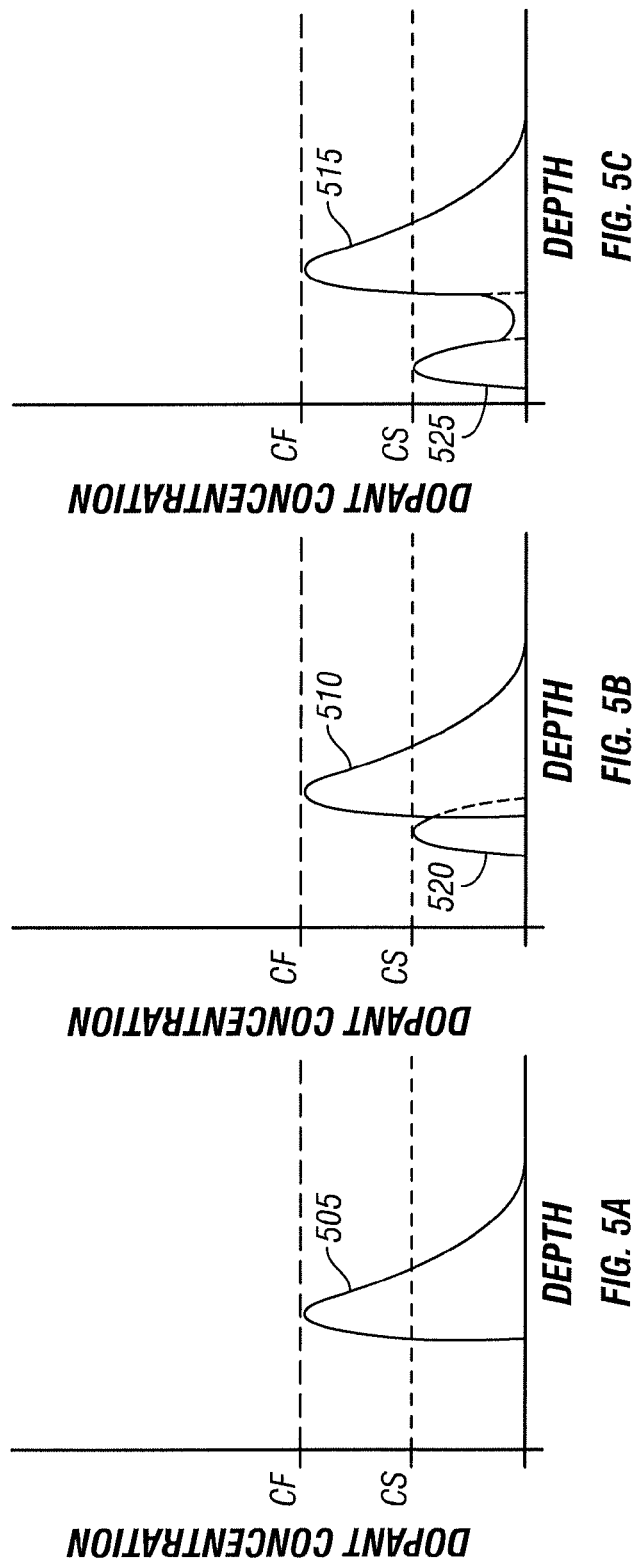

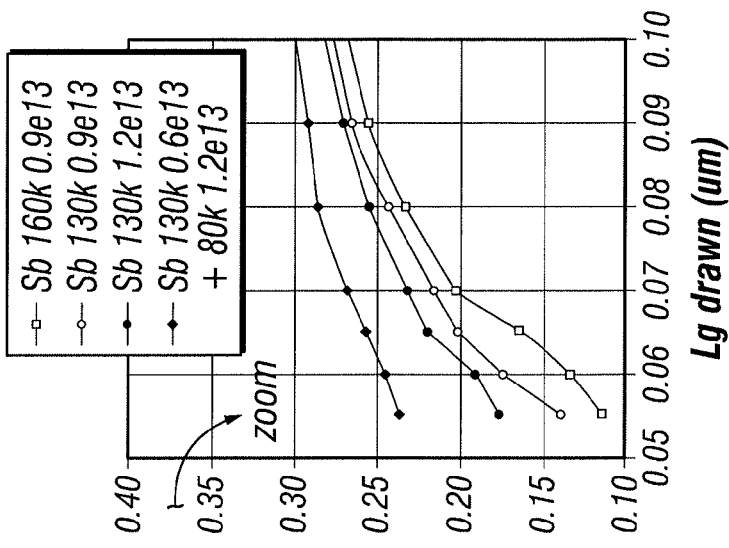
FIG. 12A
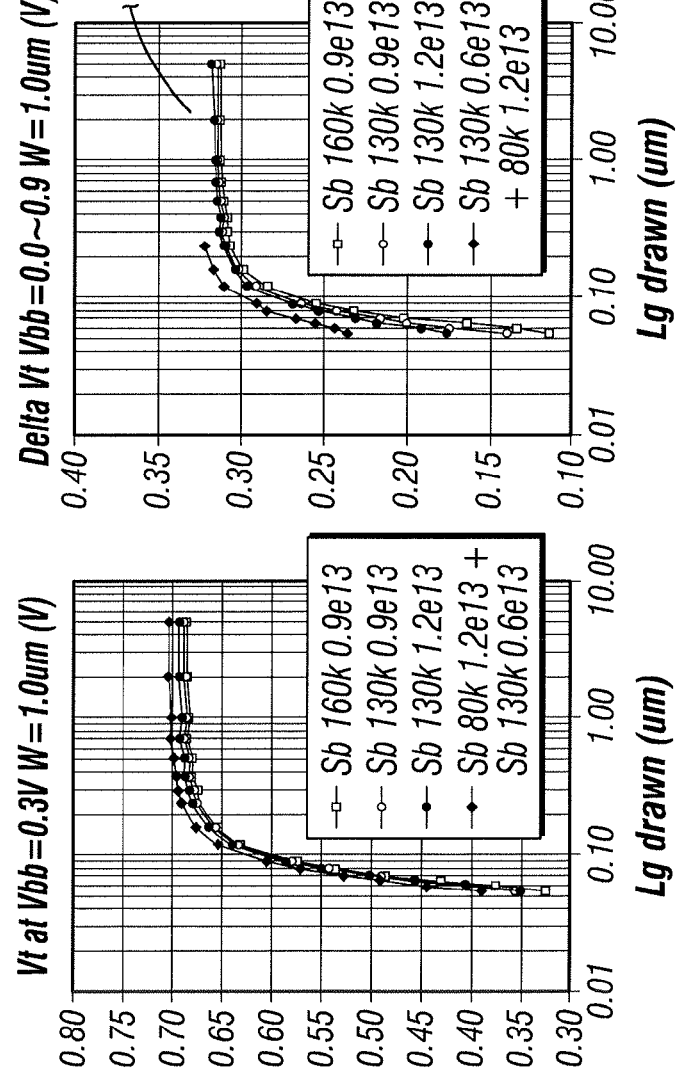
FIG. 12B
FIG. 12C

SEMICONDUCTOR STRUCTURE WITH MULTIPLE TRANSISTORS HAVING VARIOUS THRESHOLD VOLTAGES

CROSS REFERENCE TO RELATED APPLICATIONS

This application is a divisional of U.S. application Ser. No. 13/926,555 filed Jun. 25, 2013 which claims the benefit of U.S. Provisional Application No. 61/665,113 filed Jun. 27, 2012.

TECHNICAL FIELD

The following disclosure relates in general to semiconductor devices and processing and more particularly to a semiconductor structure with multiple transistor elements having various threshold voltages and method of fabrication thereof.

BACKGROUND

Many integrated circuit designs use a variety of cells that perform specific functions. Integrated circuits can include logic, memory, controller and other functional blocks. Semiconductor integrated circuits are fabricated in a semiconductor process, often using a CMOS process. Transistors are formed in a semiconductor substrate, and usually involve a sequence of fabrication steps that result in a gate with adjacent source and drain, the source and drain being formed in a channel. A key setting for a transistor is the threshold voltage, which in turn determines the voltage at which a transistor can be switched. Low threshold voltage devices are generally used for high speed circuits, though low threshold voltage devices tend to have higher leakage power. High threshold voltage devices tend to result in slower speeds but are usually implemented when power reduction is desired. It is generally known that variation in threshold voltage from the device specification is undesirable. Threshold voltage can be set by incorporating dopants into the transistor channel, either by way of direct channel implantation adjacent the gate oxide or by way of pocket or halo implants adjacent the source and drain. Such channel doping or halo implants also have the positive effect of reducing short channel effects especially as the gate length shrinks. Threshold voltage variation can increase with scaling, however, because of random dopant fluctuations in the implanted channel area. The variation problem worsens as critical dimensions shrink because of the greater impact of dopant fluctuations as the volume of the channel becomes smaller. As a result, circuit design has become more limited over time in that circuit designers must account for greater potential variation in the devices with smaller gate dimensions, thus making it impossible to design circuits with the technical freedom needed to build new and improved semiconductor chips. While CMOS technology has improved to allow continued scaling down of critical dimension, the associated and desired scaling down of voltage has not followed.

BRIEF DESCRIPTION OF THE DRAWINGS

For a more complete understanding of the present disclosure and the advantages thereof, reference is now made to the following descriptions taken in conjunction with the accompanying drawings, wherein like reference numeral represent like parts, in which:

FIGS. 2A-2C illustrate the dopant profiles for exemplary screening regions for three different transistor device types constructed on a common substrate;

FIGS. 4A-4C are graphs illustrating an alternative dopant profile for exemplary screening regions for three different transistor device types constructed on a common substrate;

FIGS. 5A-5C are graphs illustrating still another alternative scheme for setting Vt across three types of transistors;

FIGS. 12A-12C illustrate threshold voltage as a function of gate length for DDC transistors having single and dual APT regions formed using different implant conditions;

DETAILED DESCRIPTION

Transistors having improved threshold voltage variation and therefore enabling the scaling of supply voltage are disclosed. Embodiments of structures and fabrication methods allowing for reliable setting of threshold voltage, and with improved mobility, transconductance, drive current, strong body coefficient and reduced junction leakage are provided. More specifically, embodiments of doping profiles to result in different Vt targets for the different transistor device types without the use of pocket or halo implants or channel implantation adjacent the gate oxide are disclosed.

Figure 1:
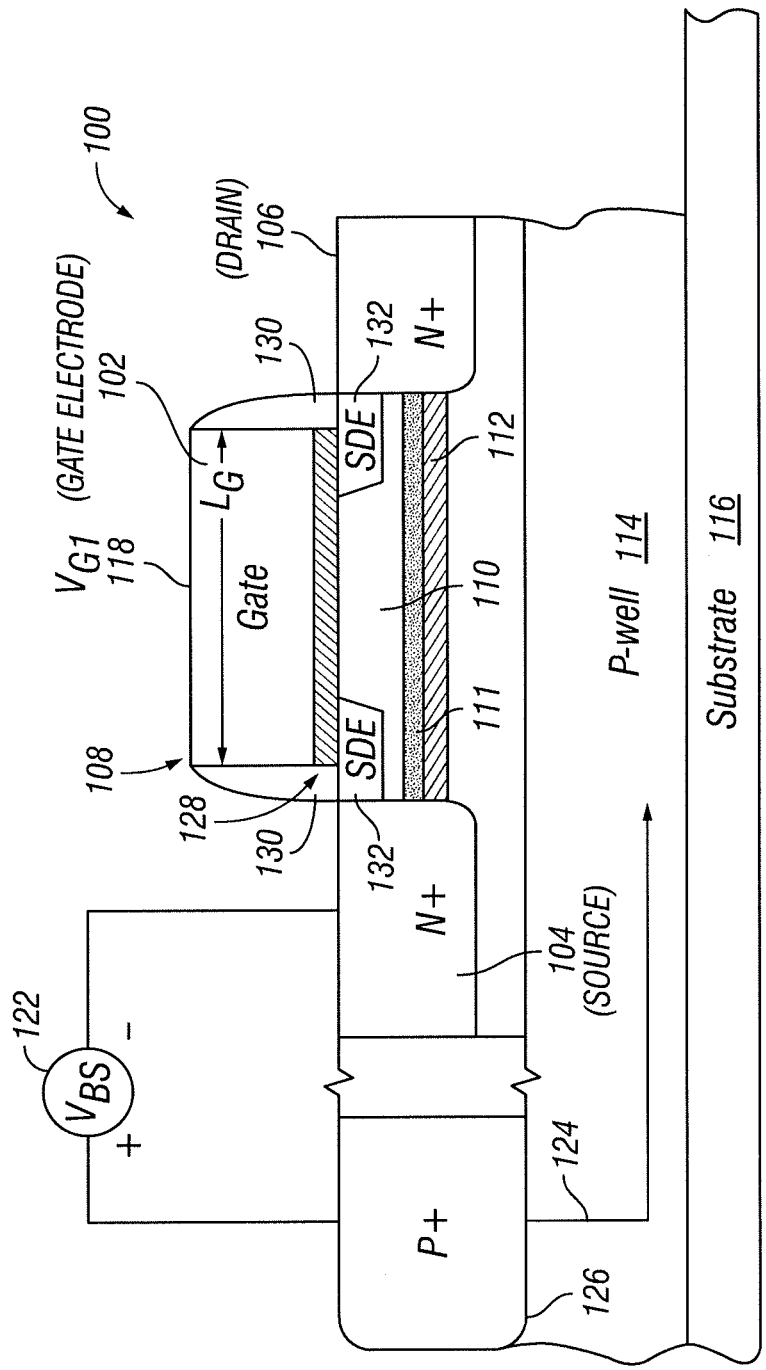
FIG. 1 shows an embodiment of a Deeply Depleted Channel (DDC) transistor 100 having an enhanced body coefficient, along with the ability to set threshold voltage Vt with enhanced precision.

FIG. 1 shows an embodiment of a Deeply Depleted Channel (DDC) transistor 100 having an enhanced body coefficient, along with the ability to set threshold voltage Vt with enhanced precision. The DDC transistor 100 includes a gate electrode 102, source 104, drain 106, and a gate dielectric 128 positioned over a substantially undoped channel 110. Lightly doped source and drain extensions (SDE)

132, positioned respectively adjacent to source 104 and drain 106, extend toward each other, setting the transistor channel length.

The exemplary DDC transistor 100 is shown as an N-channel transistor having a source 104 and drain 106 made of N-type dopant material, formed upon a substrate such as a P-type doped silicon substrate providing a P-well 114 formed on a substrate 116. In addition, the N-channel DDC transistor in FIG. 1 includes a highly doped screening region 112 made of P-type dopant material, and a threshold voltage set region 111 made of P-type dopant material. Substantially undoped channel 110 is preferably formed using epitaxially-grown silicon, using a process recipe that is intended to result in undoped crystalline silicon. Although substantially undoped channel 110 may be referred to herein as the "undoped channel", it is understood that a minimum or baseline level of dopants are present due to unavoidable introduction of some foreign material during the otherwise intrinsic epitaxial process. As a general matter, the "undoped channel" preferably has a dopant concentration of less than $5 \times 10^{17}$ atoms/cm$^3$ in some portions thereof. However, it is desirable that at least a portion of the channel underlying the gate remains undoped in the final transistor structure and certain process steps are chosen to achieve this configuration. An N-channel DDC transistor is shown in FIG. 1. Similarly, a P-channel DDC transistor can be achieved by interchanging N and P regions.

The features of DDC transistor 100 can result in various transistor device types. Such transistor device types include, but are not limited to: P-FETs, N-FETs, FETs tailored for digital or analog circuit applications, high-voltage FETs, high/normal/low frequency FETs, FETs optimized to work at distinct voltages or voltage ranges, low/high power FETs, and low, regular, or high threshold voltage transistors (i.e. low Vt, regular Vt, or high Vt—also referred to as LVt, RVt, or HVt, respectively), etc. Transistor device types are usually distinguished by electrical characteristics (e.g. threshold voltage, mobility, transconductance, linearity, noise, power), which in turn can lend themselves to be suitable for a particular application (e.g., signal processing or data storage). Since a complex integrated circuit such as, for instance, a system on a chip (SoC) may include many different circuit blocks having different transistor device types to achieve the desired circuit performance, it is desirable to use a transistor structure that can be readily fabricated to result in the various transistor device types.

A process for forming a DDC transistor may begin with forming the screening region 112. In certain embodiments, the screening region is formed by providing the substrate having the P-well 114 and implanting screening region dopant material thereon. Other methods may be used to form the screening region such as in-situ doped epitaxial silicon deposition, or epitaxial silicon deposition followed by vertically directed dopant implantation to result in a heavily doped region embedded a vertical distance downward from gate 102. Preferably, the screening region is positioned such that the top surface of the screening region is located approximately at a distance of Lg/1.5 to Lg/5 below the gate (where Lg is the gate length). The screening region is preferably formed before STI (shallow trench isolation) formation. Boron (B), Indium (I), or other P-type materials may be used for P-type NMOS screening region material, and arsenic (As), antimony (Sb) or phosphorous (P) and other N-type materials can be used for PMOS screening region material. The screening region 112, which is considered heavily doped, has a significant dopant concentration, which may range between about $5 \times 10^{18}$ to $1 \times 10^{20}$ dopant atoms/cm$^3$. Generally, if the screening region 112 dopant level is on the higher end of the range, the screening region 112 can simultaneously function as the threshold voltage setting region.

Though exceptions may apply, as a general matter it is desirable to take measures to inhibit the upward migration of dopants from the screening region, and in any event, controlling the degree to which dopants may migrate upward as a mechanism for controlling the threshold voltage setting is desired. All process steps occurring after the placement of screening region dopants are preferably performed within a limited thermal budget. Moreover, for those dopants that tend to migrate or for flexibility in using a higher temperature in subsequent processes, a germanium (Ge), carbon (C), or other dopant migration resistant layer can be incorporated above the screening region to reduce upward migration of dopants. The dopant migration resistant layer can be formed by way of ion implantation, in-situ doped epitaxial growth, or other process.

An optional threshold voltage set region 111 is usually positioned above the screening region 112. The threshold voltage set region 111 can be either in contact with, adjacent to, incorporated within, or vertically offset from the screening region. In certain embodiments, the threshold voltage set region 111 is formed by ion implantation into the screening region 112, delta doping, controlled in-situ deposition, or by atomic layer deposition. In alternative embodiments, the threshold voltage set region 111 can be formed by way of controlled outdiffusion of dopant material from the screening region 112 into an undoped epitaxial layer using a predetermined thermal cycling recipe. Preferably, the threshold voltage set region 111 is formed before the undoped epitaxial layer is formed, though exceptions may apply. The threshold voltage is designed by targeting a dopant concentration and thickness of the threshold voltage set region 111 suitable to achieve the threshold voltage desired for the device. Note that if the screening region 112 concentration is sufficiently high, then the screening region 112 can function as the threshold voltage setting region and a separate threshold voltage setting region is not needed. Preferably, the threshold voltage set region 111 is fabricated to be a defined distance below gate dielectric 128, leaving a substantially undoped channel layer directly adjacent to the gate dielectric 128. The dopant concentration for the threshold voltage set region 111 depends on the desired threshold voltage for the device, taking into account the location of the threshold voltage set region 111 relative to the gate. Preferably, the threshold voltage set region 111 has a dopant concentration between about $1 \times 10^{18}$ dopant atoms/cm$^3$ and about $1 \times 10^{19}$ dopant atoms per cm$^3$. Alternatively, the threshold voltage set region 111 can be designed to have a dopant concentration that is approximately one third to one half of the concentration of dopants in the screening region 112.

The final layer of the channel is formed preferably by way of a blanket epitaxial silicon deposition, although selective epitaxial deposition may be used. The channel 110 is structured above the screening region 112 and threshold voltage set region 111, having a selected thickness tailored to the electrical specifications of the device. The thickness of the substantially undoped channel 110 usually ranges from approximately 5-25 nm with a thicker undoped channel 110 usually used for a lower Vt device. To achieve the desired undoped channel 110 thickness, a thermal cycle may be used to cause an outdiffusion of dopants from the screening region 112 into a portion of the epitaxial layer to result in a threshold voltage setting region 111 for a given undoped channel region 110 thickness. To control the degree of outdiffusion of dopants across a variety of device types, migration resistant layers of C, Ge, or the like can be utilized in selected devices. By achieving a thickness of the threshold voltage region by way of the ion implantation, in-situ epitaxial growth or other methods such as thermal cycle to effect a controlled diffusion a distance upward into the channel, different thicknesses of channel 110 may be achieved. Still further methods for establishing different thicknesses of channel 110 may include selective epitaxial growth or a selective etch back with or without a blanket epitaxial growth or other thickness reduction. Isolation structures are preferably formed after the channel 110 is formed, but isolation may also be formed beforehand, particularly if selective epitaxy is used to form the channel 110.

The transistor 100 is completed by forming a gate electrode 102 which may be a polysilicon gate or a metal gate stack, as well as SDE 132, spacers 130, and source 104 and drain 106 structures using conventional fabrication methods, with the caveat that the thermal budget be maintained within a selected constraint to avoid unwanted migration of dopants from the previously formed screening region 112 and threshold voltage setting region 111. Note that versions of transistor 100 can be implemented in any process node using a variety of transistor structural schemes including, in the more advanced nodes, using techniques to apply stress or strain in the channel. In conventional field effect transistors (FETs), the threshold voltage can be set by directly implanting a "threshold voltage implant" into the channel, raising the threshold voltage to an acceptable level that reduces transistor off-state leakage while still allowing speedy transistor switching. The threshold voltage implant generally results in dopants permeating through the entire channel region. Alternatively, the threshold voltage ($V_t$) in conventional FETs can also be set by a technique variously known as "halo" implants, high angle implants, or pocket implants. Such implants create a localized, graded dopant distribution near a transistor source and drain that extends a distance into the channel. Both halo implants and channel implants introduce dopants into the channel, resulting in random fluctuations of dopants in the channel which in turn can affect the actual threshold voltage for the device. Such conventional threshold voltage setting methods result in undesirable threshold voltage variability between transistors and within transistor arrays. Additionally, such conventional threshold voltage setting methods decrease mobility and channel transconductance for the device.

The screening region 112 creates a strong body coefficient amenable for receiving a body bias. A body tap 126 to the screening region 112 of the DDC transistor can be formed in order to provide further control of threshold voltage. The applied bias can be either reverse or forward biased, and can result in significant changes to threshold voltage. Bias can be static or dynamic, and can be applied to isolated transistors, or to groups of transistors that share a common well. Biasing can be static to set threshold voltage at a fixed set point or dynamic to adjust to changes in transistor operating conditions or requirements. Various suitable biasing techniques are disclosed in U.S. Pat. No. 8,273,617, the entirety of which is herein incorporated by reference.

Further examples of transistor structure and manufacture suitable for use in DDC transistors are disclosed in U.S. patent application Ser. No. 12/895,785 filed Sep. 30, 2010 titled "Advanced Transistors with Threshold Voltage Set Dopant Structures" by Lucian Shifren, et al., U.S. Pat. No. 8,421,162, U.S. patent application Ser. No. 12/971,884 filed on Dec. 17, 2010 titled "Low Power Semiconductor Transistor Structure and Method of Fabrication Thereof" by Lucian Shifren, et al., and U.S. patent application Ser. No. 12/971,955 filed on Dec. 17, 2010 titled "Transistor with Threshold Voltage Set Notch and Method of Fabrication Thereof" by Reza Arghavani, et al., the respective contents of which are incorporated by reference herein in their entirety.

Many integrated circuit designs benefit from the availability of a variety, or range of transistor device types that can be included in those integrated circuits. The availability of multiple transistor device types provides engineers with the resources to produce optimized circuit designs, as well as to produce circuit designs that might otherwise be unachievable if limited to a small number of transistor device types. As a practical matter, it is desirable that each integrated circuit on a wafer be able to incorporate all, or any subset of, the range of transistor device types available in an integrated circuit manufacturing process while achieving a limited variation in threshold voltage both locally and globally. It is also desirable to reduce the off-state leakage current and to achieve a limited variation in the off-state leakage current for the range of transistor device types available in the integrated circuit.

Various embodiments described below use a combination of ion implantations to form dual screening regions to achieve different transistor device types. Dual screening regions are advantageously used to provide different transistor device types in terms of threshold voltages while achieving a reduced off-state leakage current. In comparison, a transistor device that uses a single screening region may have a similar threshold voltage but may have higher junction leakage. With dual screens, each peak screening region dopant concentration may be reduced compared with the case of the dopant concentration of a single screening region for a given threshold voltage. Additionally, dual antipunchthrough (APT) regions are disclosed. Dual APT can provide a specified body coefficient using a lower peak concentration as compared to the peak concentration of a single implant APT region for a substantially similar body coefficient. Dual APT regions also provide the benefit of reducing the off-state leakage current of the different transistor device types, for instance if dual APT regions use a combination of a shallower and deeper APT region implants compared to a mid-energy single APT region implant. Transistors having shallower APT regions (due to lower energy APT region implants) can typically include a lower peak screening region dopant concentration to achieve a target threshold voltage. The advantages of dual APT regions can be obtained whether with single screening regions or dual screening regions.

Typically, the value of the threshold voltage is related to the concentration of dopants in the screening region. For various embodiments described below, the concentration of dopants is illustrated as a function of depth (also referred to as a dopant profile), where the zero depth position typically approximates the position of the gate oxide in the device.

FIGS. 2A-2C illustrate the dopant profiles for exemplary screening regions for three different transistor device types constructed on a common substrate, in which the doped regions are separated from the gate by a substantially undoped semiconductor layer (preferably intrinsic silicon having a dopant concentration of less than $5\times10^{17}$ atoms/$cm^3$). A range of Vt's can be achieved thereby, for instance a low threshold voltage (LVt) 205, a regular threshold voltage (RVt) 210, and a high threshold voltage (HVt) 215. The screening region dopant profile for the LVt transistor device type has a peak screening region dopant concentration of CF1 atoms/cm$^3$, the screening region dopant profile for the RVt transistor device type has a peak screening region dopant concentration of CF2 atoms/cm$^3$, and the screening region dopant profile for the HVt transistor has a peak screening region dopant concentration of CF3 atoms/cm$^3$, where CF1<CF2<CF3. Such dopant concentrations can be achieved by selected doses for the implants. In one embodiment, Sb is implanted at a dose of $1 \times 10^{13}$ atoms/cm$^2$, $2 \times 10^{13}$ atoms/cm$^2$, and $3 \times 10^{13}$ atoms/cm$^2$ to form the screening regions of the LVt, RVt, and HVt transistor device types respectively. Implant energies in the range of 10-50 keV can be used to implant the screening region dopants, where the location of the peak is generally related to the implant energy used. The deeper the peak desired, the higher the selected energy for the implant. In the embodiment of FIGS. 2A-2C, the screening region dopants for the three transistor device types are implanted using the same implant energy but with different doses resulting in three screening region dopant profiles 205, 210, and 215 having three different peak concentrations, where the peak is located at approximately the same depth relative to the top surface of the substrate.

Figure 3C:
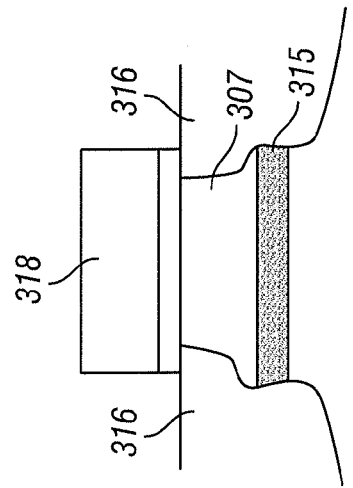
FIGS. 3A-3C illustrate representative structures of the transistor device types corresponding to the dopant profiles of FIGS. 2A-2C.
Figure 3B:
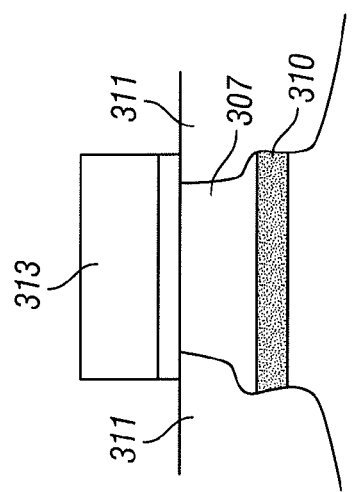
Figure 3A:
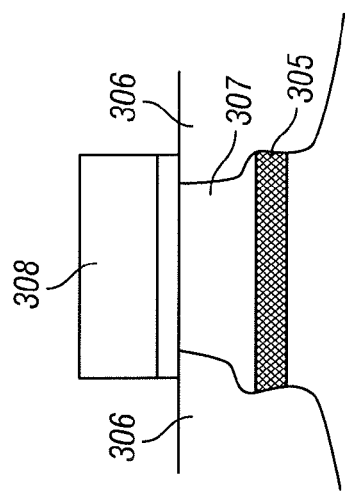

FIGS. 3A-3C illustrate representative structures of the transistor device types corresponding to the dopant profiles of FIGS. 2A-2C, showing in cross-section how screening regions may appear. In FIG. 3A, there may be a screening region 305 placed a defined depth below gate stack 308 with an undoped channel 307 in the space between screening region 305 and gate stack 308 and having a defined thickness selected to achieve threshold voltage, junction leakage, and other device characteristics. Preferably, the thickness of screening region 305 is about 3 nm to 10 nm in thickness or more, but in any event is preferably less thick than the gate length of gate stack 308. Source and drain pair 306 are on either side of screening region 305 such that screening region 305 extends laterally across and underneath undoped channel 307 and abutting the edges of source and drain pair 306. IN FIG. 3B, there may be screening region 310 that is more heavily doped than screening region 305, placed a similar depth below gate stack 313 as screening region 305 to its gate stack 308, with undoped channel 307 formed using a blanket epitaxial process so that it forms the same silicon thickness for the undoped channel for all of the devices having screening regions. Screening region 310 has a defined thickness selected to achieve threshold voltage, junction leakage, and other device characteristics. Preferably, the thickness of screening region 310 is about 3 nm to 15 nm in thickness and may be thicker than screening region 305, but in any event is preferably less thick than the gate length of gate stack 308. Source and drain pair 311 are on either side of screening region 310 such that screening region 310 extends laterally across and underneath undoped channel 307 and abutting the edges of source and drain pair 311. IN FIG. 3C, there may be screening region 315 that is more heavily doped than screening region 310, placed a similar depth below gate stack 318 as screening region 310 and 305 to their respective gate stacks 313 and 308, with undoped channel 307 forming the space between screening region 315 and gate stack 318. Screening region 315 has a defined thickness selected to achieve threshold voltage, junction leakage, and other device characteristics. Preferably, the thickness of screening region 315 is about 3 nm to 20 nm in thickness and may be thicker than screening regions 310 and 305, but in any event is preferably less thick than the gate length of gate stack 318. Source and drain pair 316 are on either side of screening region 315 such that screening region 315 extends laterally across and underneath undoped channel 307 and abutting the edges of source and drain pair 316. The transistors illustrated in FIGS. 3A-3C are to demonstrate exemplary schemes for placement of the respective screening regions 305, 310, and 315, though specific implementations may differ depending on a variety of desired characteristics for the devices in the context of the semiconductor fabrication node. For instance, source and drains may be elevated and fabricated using selective epitaxial growth using a silicon, silicon-germanium, or other material to form the source and drain or any other process that imparts a stress in the channel.

Note that it may be desired to locate the screening regions at different depths to achieve different threshold voltage and other characteristics for the device. Screening region depth can be controlled based on controlling the process settings, for instance higher ion implant energy to drive the ions deeper or lower ion implant energy to maintain a more shallow implanted region. After the screening region dopants are emplaced, the channel is completed by depositing an epitaxial silicon layer on the substrate over the screening region dopants. It follows that, if the screening region dopants are at the approximately same depth below the top surface of the substrate, then to achieve differing Vt's, different implant doses are used to modulate the Vt value. A higher implant dose generally results in a higher concentration of dopants. A lower implant dose generally results in a lesser concentration of dopants. If the screening region dopant implant process uses differing energies, then the Vt values will be modulated based upon the different depths of the screens or, put another way, based upon the different resulting relative thicknesses of the undoped epitaxial layer.

FIGS. 4A-4C are graphs illustrating an alternative dopant profile for exemplary screening regions for three different transistor device types constructed on a common substrate. Note that the profiles may represent the distribution of dopant material prior to anneal. Post anneal, the profiles may be less distinct. Preferably, the profiles are achieved by way of separate ion implant steps. The common substrate is doped to create different transistor device types, e.g. a low threshold voltage (LVt), a regular threshold voltage (RVt), and a high threshold voltage (HVt) transistor corresponding to FIGS. 4A-4C respectively. Preferably, the screening region dopant profiles for the three transistor device types illustrated in FIGS. 4A-4C are obtained by performing multiple screening region dopant implants. In one embodiment, a first screening region dopant can be implanted for all three devices as shown herein as dopant profiles 405, 410, and 415 for the LVt, RVt, and HVt transistor device types respectively. An additional implant step is performed for the RVt transistor device type to form the second screening region dopant profile 420, such that the combination of the dopant profiles 410 and 420 sets the threshold voltage of the RVt transistor device type. An additional implant step is performed for the HVt transistor device type to form the second screening region dopant profile 425, where the combination of the dopant profiles 415 and 425 sets the threshold voltage of the HVt transistor device type. The advantage of the scheme illustrated in FIGS. 4A-4C is that a reduced dose implant can be used to achieve a peak concentration in the low end of the screening region range and, if desired, the same dose and energy for the screening region for the LVt device can be used for the RVt and HVt devices. Instead of relying upon a higher peak concentration for the screening region for the RVt and HVt devices, a reduced peak concentration is used, preferably at approximately the same depth within the substrate for each of the devices, and the Vt is achieved by implanting a secondary dopant profile at a location adjacent to but closer to the gate using a dose selected to result in the peak concentration appropriate to set the Vt for the device. As illustrated in FIGS. 4A-4C, the LVt device does not contain a secondary implant and uses the initial screening region implant at peak concentration CF1, the RVt device includes the screening region implant at peak concentration CF1 and contains a secondary implant at concentration CS1, and the HVt device includes the screening region implant at peak concentration CF1 and contains a secondary implant at concentration CS2 which is higher than CS1. All peak concentrations of dopants and relative depths within the substrate are determined as part of the device design to achieve the desired Vt while comprehending other design constraints including leakage, drive-current, and other factors understood by those skilled in the art.

FIGS. 5A-5C are graphs illustrating still another alternative scheme for setting Vt across three types of transistors. The common substrate is doped to create dopant profiles for different transistor device types, e.g. a low threshold voltage (LVt), a regular threshold voltage (RVt), and a high threshold voltage (HVt) transistor. Preferably, a first screening region dopant is implanted for all three transistor device types resulting in first screening region dopant profiles 505, 510, and 515 for the LVt, RVt, and HVt transistor device types respectively. First screening region dopant profiles 505, 510, and 515 are preferably formed to have approximately the same peak concentration, designated as CF, at approximately the same depth within the substrate. An additional screening region dopant implant step is performed for the RVt transistor device type to form the second screening region dopant profile 520 at a peak concentration of CS, where the combination of the dopant profiles 510 and 520 sets the threshold voltage of the RVt transistor device type. An additional screening region dopant implant step is performed for the HVt transistor device type to form the second screening region dopant profile 525, using a reduced energy with the same or approximately the same dose so that second screening region dopant profile 525 is at peak concentration of approximately CS but offset from the location of screening region dopant profile 515 to be located closer to the gate. Dopant profiles 515 and 525 may be separate from each other but connected by a lesser amount of dopant concentration as shown, namely a valley between the two peaks, or the dopant profiles 515 and 525 may be isolated from each other. In effect, the undoped channel for the device at FIG. 5C is thinner than for FIG. 5B and FIG. 5A. The combination of the dopant profiles 515 and 525 sets the threshold voltage of the HVt transistor device type. The second screening region implant for the RVt and HVt transistor device types can be performed using the same dopant species at a substantially similar dose but using different implant energies, such that the peak dopant concentrations of the second dopant profile is approximately the same, but the peak is positioned at a different depth for the two transistor device types. In alternative embodiments, a combination of different dopant species, different dopant doses, and different implant energies can be used to implant the second dopant to form the screening regions of the different transistor device types. All peak concentrations of dopants and relative depths within the substrate are determined as part of the device design to achieve the desired Vt while comprehending other design constraints including leakage, drive-current, and other factors understood by those skilled in the art.

Figure 6A:
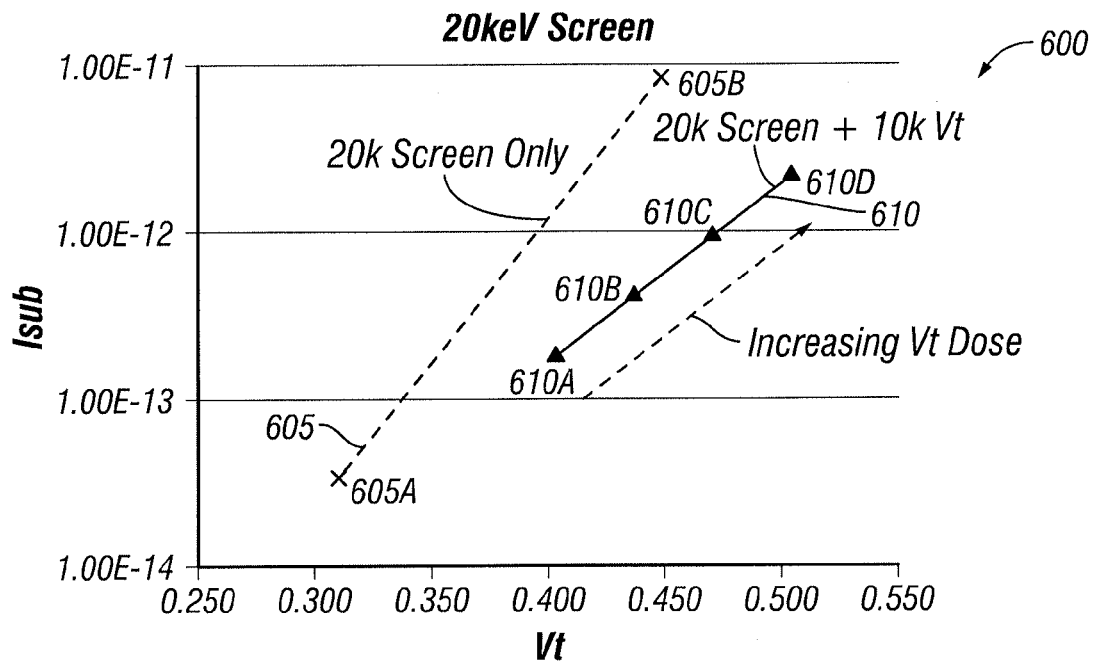
FIGS. 6A-6B illustrates the impact of the doses and implant energy used to implant the second screening region dopant on the threshold voltage and the leakage current for a PMOS transistor.

FIG. 6A illustrates the impact 600 of the doses used to implant the second screening region dopant on the threshold voltage and the leakage current for a PMOS transistor. The two graphs 605 and 610 in FIG. 6A are obtained from TCAD simulations performed for a PMOS DDC transistor having a single implant screening region and dual screening regions respectively. Graph 605 illustrates the leakage current Isub as a function of threshold voltage for a PMOS transistor having only one screening region implant consisting of Sb implanted at 20 keV using doses in the range of $1 \times 10^{13}$ to $2 \times 10^{13}$ atoms/cm$^2$. Point 605A of graph 605 corresponds to a dose of $1 \times 10^{13}$ atoms/cm$^2$ and point 605B of the graph 605 corresponds to a dose of $2 \times 10^{13}$ atoms/cm$^2$. Graph 610 illustrates the leakage current Isub as a function of threshold voltage for a PMOS transistor having dual screening regions, where the first screening region implant is Sb implanted at 20 keV using doses in the range of $1 \times 10^{13}$ to $2 \times 10^{13}$ atoms/cm$^2$ and the second screening region implant is Sb implanted at 10 keV using doses in the range of $2 \times 10^{12}$ to $5 \times 10^{12}$ atoms/cm$^2$. Point 610A corresponds to a dose of $2 \times 10^{12}$ atoms/cm$^2$, point 610B corresponds to a dose of $3 \times 10^{12}$ atoms/cm$^2$, point 610C corresponds to a dose of $4 \times 10^{12}$ atoms/cm$^2$, and point 610D corresponds to a dose $5 \times 10^{12}$ atoms/cm$^2$.

Figure 6B:
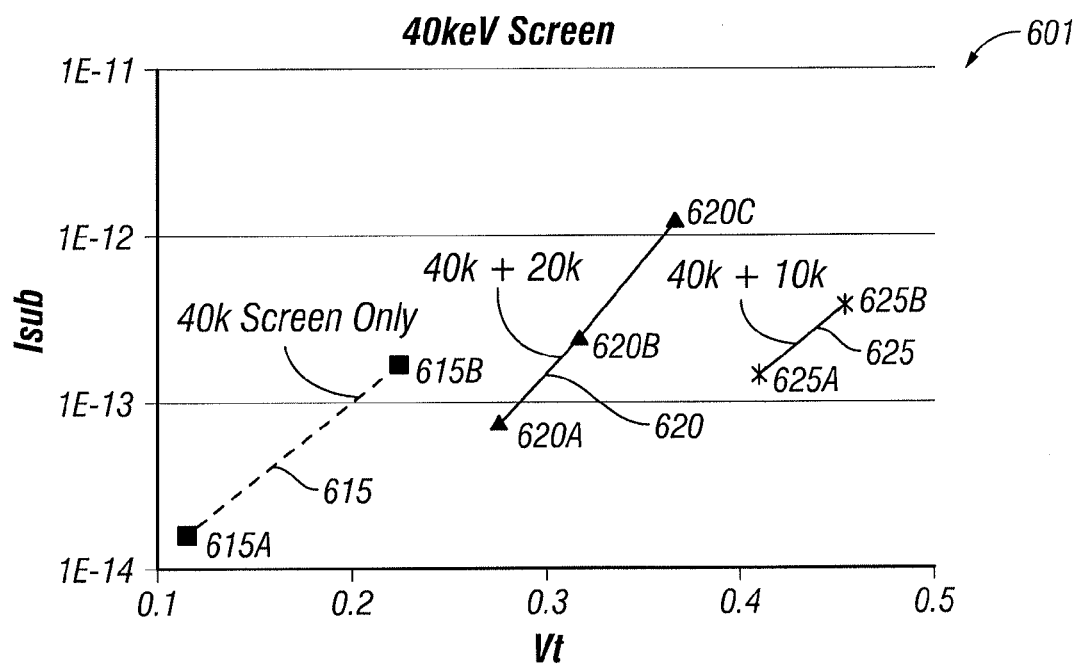

FIG. 6B illustrates the impact 601 of the implant energy used to implant the second screening region dopant on the threshold voltage and the leakage current for a PMOS transistor. The three graphs 615, 620, and 625 in FIG. 6B are obtained from TCAD simulations performed for a PMOS DDC transistor having a single screening region and dual screening regions respectively, where different implant energies are used to implant the second screening region dopant. Graph 615 illustrates the leakage current Isub as a function of threshold voltage for a PMOS transistor having only one screening region implant consisting of Sb implanted at 40 keV using doses in the range of $1 \times 10^{13}$ to $2 \times 10^{13}$ atoms/cm$^2$. Point 615A of graph 615 corresponds to a dose of $1 \times 10^{13}$ atoms/cm$^2$ and point 615B of graph 615 corresponds to a dose of $2 \times 10^{13}$ atoms/cm$^2$. Graph 620 illustrates the leakage current Isub as a function of threshold voltage for a PMOS transistor having dual screening regions, where the first screening region implant is Sb implanted at 40 keV using doses in the range of $1 \times 10^{13}$ to $2 \times 10^{13}$ atoms/cm$^2$ and the second screening region implant is Sb implanted at 20 keV using doses in the range of $0.5 \times 10^{13}$ to $1 \times 10^{13}$ atoms/cm$^2$. Point 620A corresponds to a dose of $0.5 \times 10^{13}$ atoms/cm$^2$, point 620B corresponds to a dose of $0.6 \times 10^{13}$ atoms/cm$^2$, and point 620C corresponds to a dose of $1 \times 10^{13}$ atoms/cm$^2$. Graph 625 illustrates the leakage current Isub as a function of threshold voltage for a PMOS transistor having dual screening regions, where the first screening region implant is Sb implanted at 40 keV using doses in the range of $1 \times 10^{13}$ to $2 \times 10^{13}$ atoms/cm$^2$ and the second screening region implant is Sb implanted at 10 keV using doses in the range of $0.5 \times 10^{13}$ to $0.6 \times 10^{13}$ atoms/cm$^2$. Point 625A corresponds to a dose of $0.5 \times 10^{13}$ atoms/cm$^2$ and point 625B corresponds to a dose of $0.6 \times 10^{13}$ atoms/cm$^2$.

Figure 7:
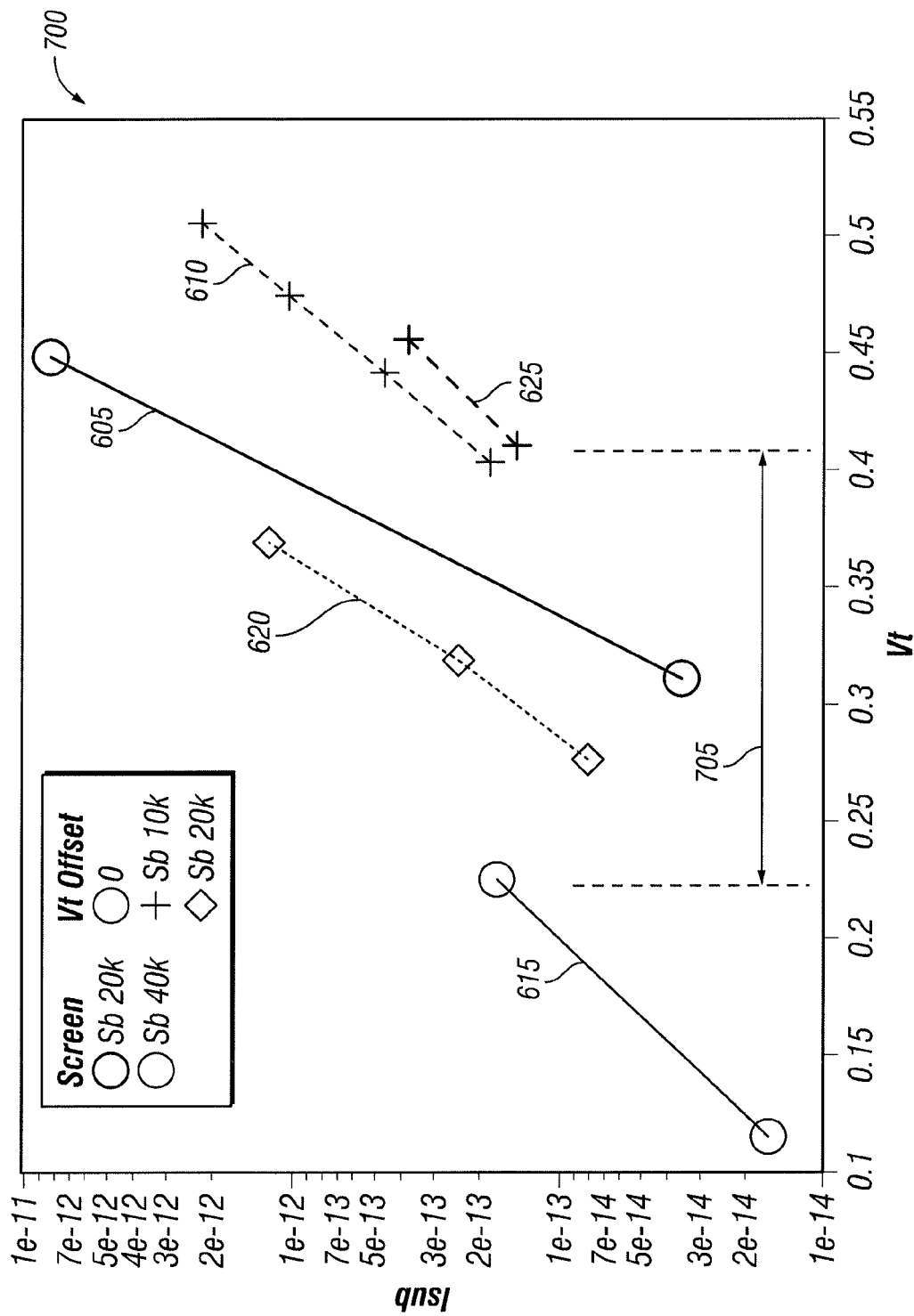
FIG. 7 illustrates the combined effect of the implant energy and implant dose used to implant the second screening region dopant on the threshold voltage and leakage current for a PMOS transistor.

FIG. 7 illustrates the combined effect 700 of the implant energy and implant dose used to implant the second screening region dopant on the threshold voltage and leakage current for a PMOS transistor. FIG. 7 includes an overlay of graphs 605 and 610 (FIG. 6A) and graphs 615, 620, and 625 (FIG. 6B). It is noted that a 200 mV range of threshold voltage, as indicated by the interval 705, can be obtained at substantially the same leakage by appropriate selection of the first screening region implant and the second screening region implant conditions. It is also noted that the graphs 610 and 625 have substantially similar slope and that both graphs show substantially similar threshold voltage and leakage current for the same second screening region implant dose. Therefore, the implant conditions of the second screening region dopant can have a dominant effect on setting the threshold voltage.

Figure 8A:
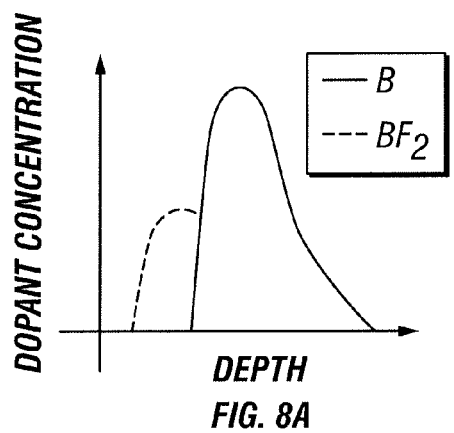
FIGS. 8A and 8B illustrate embodiments that advantageously use two different dopant species for the two screening region implants used to form dual screening regions.
Figure 8B:
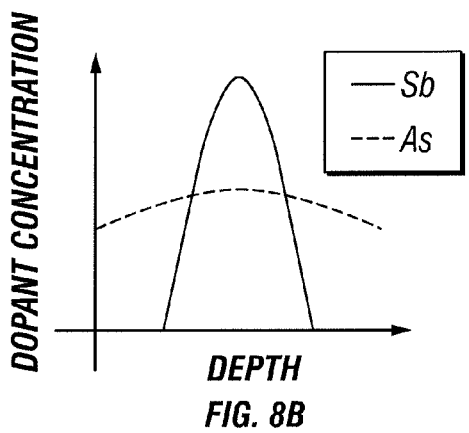

The dual screening regions described above can be formed by implanting either the same dopant species for the first screening region implant or a different dopant species can be used for the second screening region implant, wherein the dopant species are of the same polarity. FIGS. 8A and 8B illustrate embodiments that advantageously use two different dopant species for the two screening region implants used to form the dual screening regions. FIG. 8A illustrates an embodiment, where the second dopant species is a heavier molecule than the first dopant species and, therefore, the second dopant species can be implanted using a higher implant energy to form a shallow second implant for the screening region as compared to the implant energy that would be required if the first dopant species were used to form the shallow second implant. In FIG. 8A, dual screening regions are formed for an NMOS transistor by implanting B to form the first implant and using BF2 to form the second implant. Since BF2 is approximately five times heavier than B, the implant energy used for the BF2 implant can be five times the implant energy that would be used to implant B. This is advantageous because the high energy implant can be more precisely controlled. FIG. 8B illustrates an embodiment where the first and second dopant species diffuse at different rates during dopant activation anneal. In FIG. 8B, dual screening regions are formed for a PMOS transistor by implanting Sb to form the first implant and using As to form the second implant, where the Sb and As implant energies and doses are selected to form the Sb and As doped implants at approximately the same depth. However, during subsequent thermal processing such as activation anneal, As will diffuse more than Sb and, therefore, forms a shallow doped region as illustrated in FIG. 8B. The use of a second dopant species that diffuses more also permits higher dopant energies to be used to implant the second dopant species.

Figure 9:
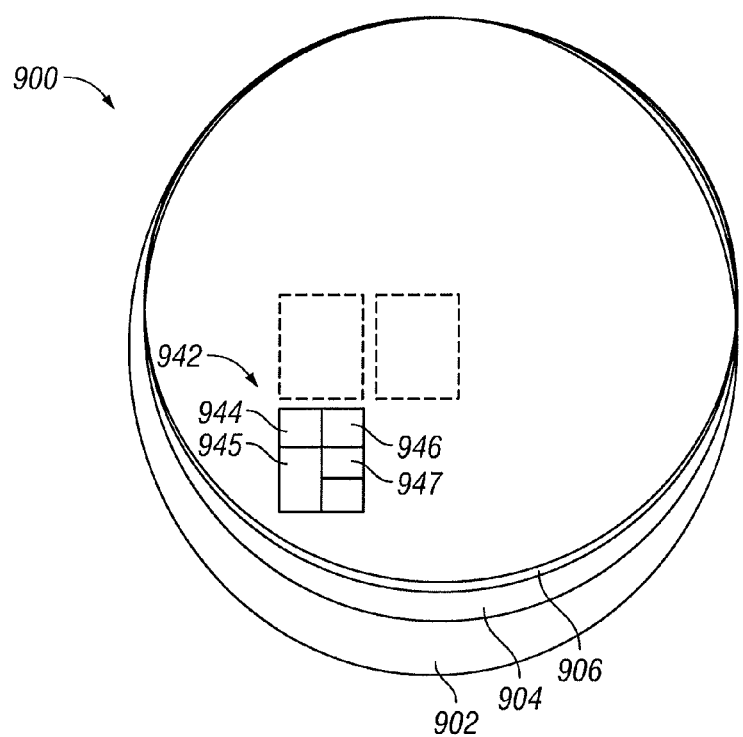
FIG. 9 illustrates a semiconductor wafer supporting multiple die.

FIG. 9 illustrates a semiconductor wafer 942 supporting multiple die such as previously described. In accordance with the present disclosure, each die can support multiple blocks of circuitry, each block having one or more transistor types. Such an arrangement enables the creation of complex system on a chip (SoC), integrated circuits, or similar die that optionally include FETs tailored for analog or digital circuit applications, along with improved transistors such as DDC transistors. For example, four useful blocks in a single die are illustrated as follows. Block 944 outlines a collection of deeply depleted channel (DDC) transistors having low threshold voltage, block 945 outlines a collection of DDC transistors having regular threshold voltage, block 946 outlines a collection of DDC transistors having high threshold voltage, and block 947 outlines a collection of DDC transistors tailored for a static random access memory cell. As will be appreciated, these transistor types are representative and not intended to limit the transistor device types that can be usefully formed on a die or wafer. Wafer 900 includes a substrate 902 (typically silicon) that can be implanted with optional APT regions and required single or dual screening regions 904 and an epitaxial blanket layer 906 formed after implantation of dopants in screening region 904. Wafer 900 can also include an optional threshold voltage set region (not shown in FIG. 9) positioned between the screening region 904 and the epitaxial blanket layer 906.

Figure 10:
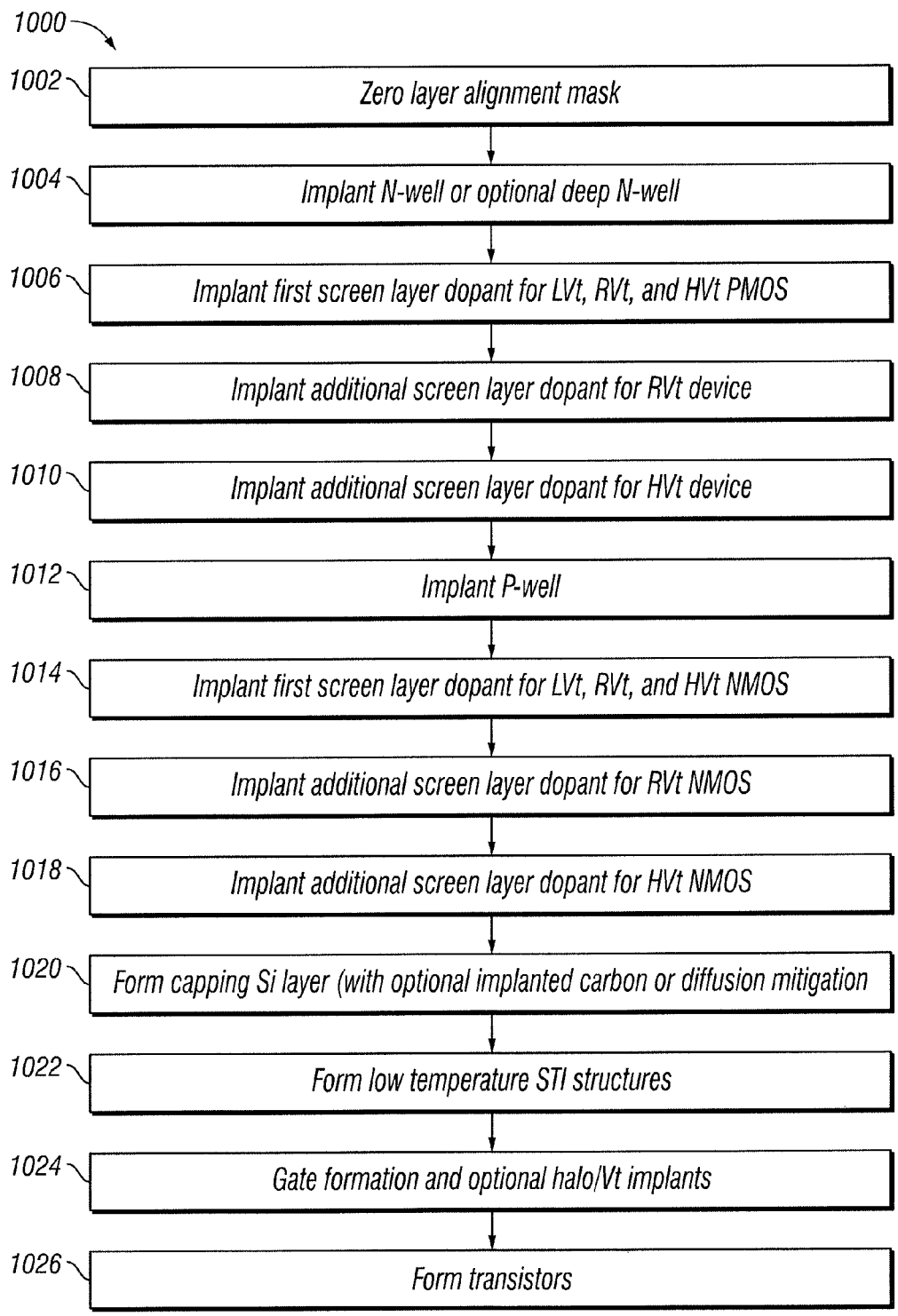
FIG. 10 illustrates one embodiment of a portion of a DDC transistor manufacturing process.

FIG. 10 illustrates one embodiment of a portion of a DDC transistor manufacturing process 1000. A semiconductor wafer is masked at step 1002 with a "zero layer" alignment mask to define dopant implantable well regions. To illustrate one embodiment, it is shown in FIG. 10 to create PMOS dopant structures followed by NMOS dopant structures, but in implementation the order can be reversed. In FIG. 10, a deep N-well can be optionally formed at step 1004 in combination with or alternative to a conventional N-well. A first screening region dopant is implanted at step 1006 to form a first highly doped screening region for the LVt, RVt, and HVt PMOS transistor device types. Typically, implant conditions for the first screening region dopant are selected to provide the target threshold voltage for the PMOS LVt transistor device type. At step 1008, the PMOS LVt and HVt devices are masked and an RVt additional screening region dopant is implanted to form dual screening regions for the RVt PMOS transistors. The implant conditions for the additional RVt screening region dopant are selected such that the combination of the first screening region dopant and the additional RVt screening region dopant provide the target threshold voltage for the PMOS RVt device. At step 1010, the PMOS LVt and RVt devices are masked and an additional HVt screening region dopant is implanted to form dual screening regions for the HVt PMOS transistors. The implant conditions for the additional HVt screening region dopant are selected such that the combination of the first screening region dopant and the additional HVt screening region dopant provide the target threshold voltage for the PMOS HVt device. In alternative embodiments, the additional RVt screening region dopant is implanted as part of the dual screening regions for both the PMOS RVt and HVt devices and both LVt and RVt devices are then masked to allow for a still further HVt screening region implant for the HVt devices only. For this embodiment, the implant condition for the first screening region dopant is selected to provide the target threshold voltage for the PMOS LVt devices, the implant conditions of the additional RVt and the additional HVt dopants are selected such the combination of the first screening region dopant and the additional RVt dopant provides the target threshold voltage for the RVt devices, and the combination of all three screening region dopants (i.e., the first screening region dopant, the additional RVt dopant, and the additional HVt dopant) provides the target threshold voltage for the HVt devices. Other well implants such as the APT region implant can be formed in the N-well before or after implanting the screening region dopants in steps 1006, 1008, and 1010.

After masking the N-well, the P-well is implanted at step 1012. A first screening region dopant is implanted at step 1014 to form a first highly doped screening region for the LVt, RVt, and HVt NMOS transistor device types. Typically, implant conditions for the first screening region dopant are selected to provide the target threshold voltage for the NMOS LVt transistor device type. At step 1016, the NMOS LVt and HVt devices are masked and an additional RVt screening region dopant is implanted to form dual screening regions for the RVt NMOS transistors. The implant conditions for the additional RVt screening region dopant are selected such that the combination of the first screening region dopant and the additional RVt screening region dopant provide the target threshold voltage for the NMOS RVt device. At step 1018, the NMOS LVt and RVt devices are masked and an additional HVt screening region dopant is implanted to form dual screening regions for the HVt NMOS transistors. The implant conditions for the additional HVt screening region dopant are selected such that the combination of the first screening region dopant and the additional HVt screening region provide the target threshold voltage for the NMOS HVt device. In alternative embodiments, the additional RVt screening region dopant is implanted as part of the dual screening regions for both the NMOS RVt and HVt devices and the NMOS LVt and RVt devices are then masked to allow for a still further screening region implant for the NMOS HVt devices only. For this embodiment, the implant condition for the first screening region dopant is selected to provide the target threshold voltage for the NMOS LVt devices, the implant conditions of the additional RVt and the additional HVt dopants are selected such the combination of the first screening region dopant and the additional RVt dopant provides the target threshold voltage for the NMOS RVt devices, and the combination of all three screening region dopants (i.e., the first screening region dopant, the additional RVt dopant, and the additional HVt dopant) provides the target threshold voltage for the NMOS HVt devices. Other well implants such as the APT region implant can be formed in the P-well before or after implanting the screening region dopants in steps 1014, 1016, and 1018.

Next, at step 1020, a capping silicon epitaxial layer is deposited/grown across the entire substrate using a process that does not include added dopant species so that the resulting channel is substantially undoped and is of a resulting thickness tailored to achieve the multitude of threshold voltages. Typically the epitaxial layer is 100% intrinsic silicon, but silicon germanium or other non-silicon in-situ deposited atoms can also be added to the epitaxial layer either across the substrate or a preselected device location using masks, though preferably the resulting material from the epitaxial growth process is intrinsic in terms of dopant-based polarity. For further adjustment of Vt, a thermal cycling can be used to cause a controlled outdiffusion of some of the screening region dopants. Following epitaxial growth, at step 1022, shallow trench isolation (STI) structures are formed. In steps 1024 and 1026, gate structures, spacers, contacts, stress implants, tensile films, dielectric coatings, and the like are then formed to establish structures for operable transistors. The processes used to form the various structures are generally conventional, though within a defined thermal cycle and with appropriate adjustments to conventional process recipes to comprehend reduced temperatures from otherwise high-temperature steps. In some devices, optionally, additional channel doping can be done using halo implants and/or traditional channel implants to render such devices conventional as opposed to DDC. It shall further be noted that the exemplary dopant profiles can be achieved using alternative processes. Although the process sequence of doping the screening region followed by forming the epitaxial undoped layer may be preferred, other processes can be used, for instance providing an undoped semiconductor region and then performing ion implantation at selected higher energies to drive the dopants down a depth through the undoped semiconductor region to achieve the exemplary dopant profiles. A further alternative process is to replace ion implantation with in-situ doped epitaxial growth to achieve the doped screening regions followed by deposition of semiconductor material to create the desired dopant profiles having the screening regions embedded a depth below the gate.

Figure 11A:
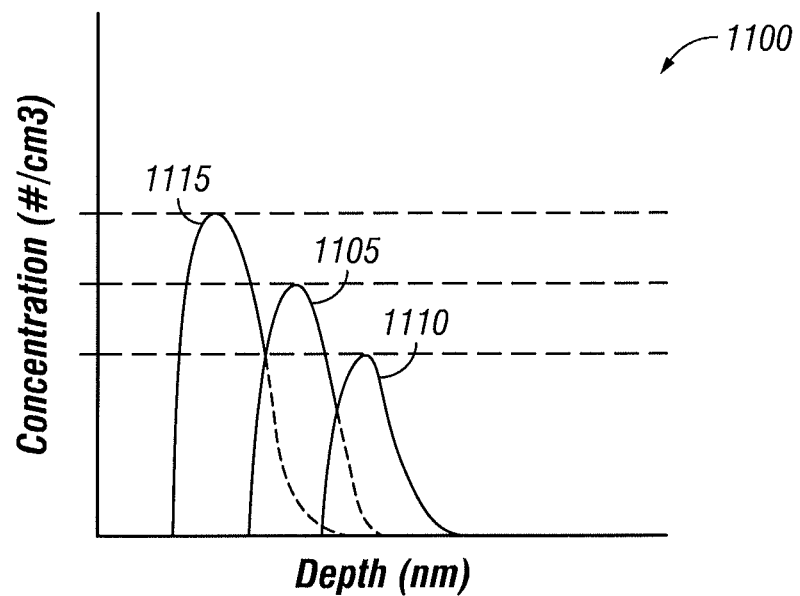
FIGS. 11A-11D illustrate a dopant profile and corresponding structure for a DDC transistor having dual antipunchthrough (APT) regions with single and dual screening regions respectively.
Figure 11B:
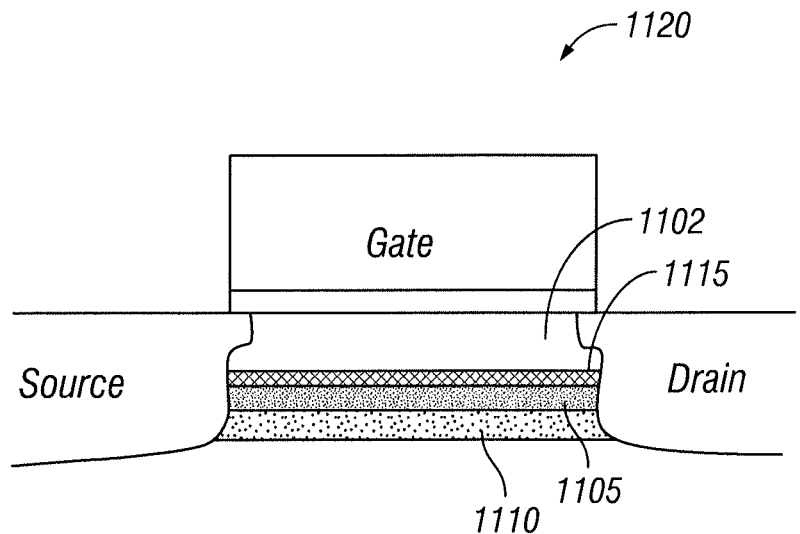

FIG. 11A illustrates a dopant profile 1100 for a DDC transistor having dual APT regions and a single screening region. FIG. 11B illustrates a structure 1120 with the dual APT regions 1105 and 1110 and the single screening region 1115 underlying an undoped channel 1102. The dopant profile 1100 includes two APT region implants having dopant profiles that form the dual APT regions 1105 and 1110. The dopant profile 1100 also includes a single screening region implant having a dopant profile that form the single screening region 1115. Typically, the peak dopant concentration of the APT region implant positioned closest to the screening region, i.e. the dopant profile for APT region 1105, is greater than the peak dopant concentration of the APT region implant for APT region 1110 that is positioned deeper in the substrate. However, in alternative embodiments, the peak dopant concentration of the dopant profiles for APT region 1105 and APT region 1110 can be approximately the same. Though shown as adjacent and in contact with one another, APT regions 1105 and 1110 and screening region 1115 may be spaced apart from each other as desired.

Figure 11C:
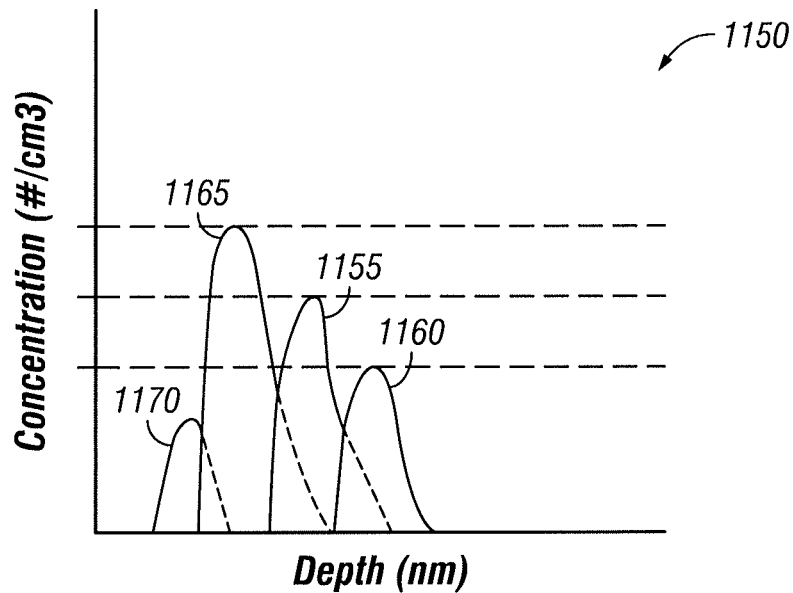
Figure 11D:
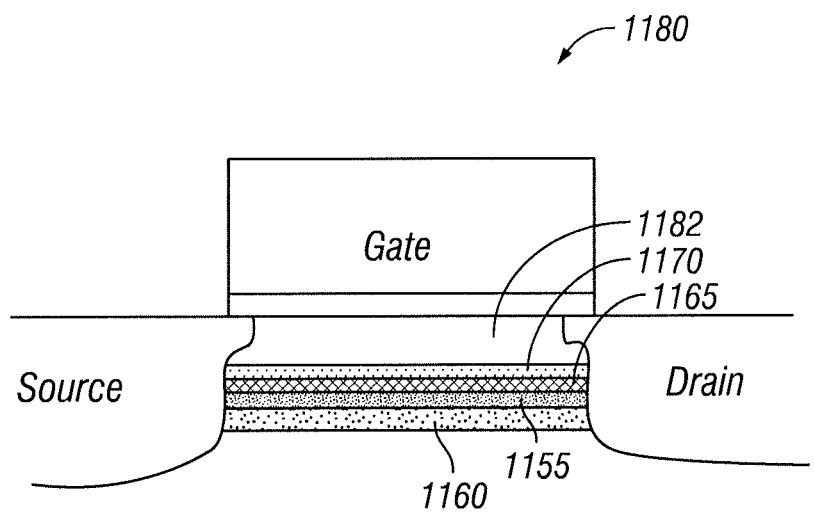

FIG. 11C illustrates a dopant profile 1150 for a DDC transistor having dual APT regions and dual screening regions. FIG. 11D illustrates a structure 1180 with the dual APT regions 1155 and 1160 and the dual screening regions 1165 and 1170 underlying an undoped channel 1182. The dopant profile 1150 includes two APT region implants having dopant profiles that form the dual APT regions 1155 and 1160. The dopant profile 1150 also includes two screening region implants having a dopant profile that form dual screening regions 1165 and 1170. The dual APT regions 1155 and 1160 can be combined with a single or dual (or triple or more) screening regions, in combinations of varying peak dopant concentrations, in embodiments that are not shown herein. Proper selection of the dual APT region dose and energy condition allows the APT region to perform its primary function of preventing deep punchthrough between the source and drain regions (which would pinch-off the screening region isolating the screening region from the body bias voltage) while minimizing the junction leakage that can be caused by excessive screening region and APT region implant dose. A single APT region implant controls the pinch-off performance through increased dose at a penalty of higher junction leakage from the increased APT region peak concentration. A wider APT region made from two separately optimized implants can be even more effective at protecting against pinch-off than a single APT region implant and allows the peak concentration for each implant to be lower than the equivalent single APT region implant resulting in overall lower leakage. Though shown as adjacent and in contact with one another, APT regions 1155 and 1160 and screening regions 1165 and 1170 may be spaced apart from each other as desired.

For the dual APT region dopant profiles illustrated in FIGS. 11A and 11C, the deep APT region implant corresponding to the dopant profiles of APT regions 1110 and 1160 can assist the respective screening regions by controlling the depletion region generated by the operational voltage and, therefore, preventing the respective screening regions from being pinched off by the depletion region. Preventing the pinch off of the screening regions allows the screening regions to be biased by a body bias voltage applied to the transistor body. Typically the peak concentration of the deep APT region implant (i.e. dopant profiles of APT regions 1110 and 1160) is selected based on a predetermined range of body bias voltages to be applied to the DDC transistor such that the selected peak concentration prevents screening region pinch off for the predetermined range of body bias voltages. Typically the peak dopant concentration of the shallow APT region implant (i.e. dopant profiles for APT regions 1105 and 1155) is selected to be lower than the peak screening region dopant concentration.

One of the advantages of using dual APT regions is that the lower peak dopant concentration in the dual APT region structure as compared to that of a single APT region helps to reduce junction leakage that may otherwise be present in a DDC device. Further, when dual APT regions are used, the device can more readily be designed with a reduced peak concentration screening region, either as a single screening region or dual screening regions, which provides advantages of reduced junction leakage. Having two implanted APT regions more readily allows for a continuum of doping extending from the screening region down through the device to the well. In contrast, a single implanted APT region generally has a tighter Gaussian distribution. The tighter Gaussian distribution makes for a potential pocket of very low-doped area between the screening region and the single APT region. Such a pocket that is very low in dopants essentially separates the screening region from the APT region, rendering the APT region less effective. The dual APT regions can also be combined with diffusion mitigation techniques, for instance Ge preamorphization implants (PAI) with carbon implants. With diffusion mitigation techniques, a selected target APT region dopant profile can be achieved using lower implant doses to form wider implanted region dopant profiles as a starting point, because the implanted APT region dopants are less apt to diffuse and spread during subsequent thermal steps.

FIGS. 12A-12C illustrate threshold voltage as a function of gate length for DDC transistors having single and dual APT regions formed using different implant conditions. FIG. 12A illustrates the changes in threshold voltage as a function of drawn channel length for a transistor having a drawn width of 1 μm at a body bias voltage of 0.3 volts. FIG. 12B illustrates the difference between the threshold voltage at a body bias voltage of 0 volts and at a body bias voltage of 0.9 volts as a function of drawn channel length for a DDC transistor having a drawn channel width of 1 μm. FIG. 12C is an expanded version of a portion of the curves illustrated in FIG. 12B. FIGS. 12B and 12C provide a measure of the changes in the body coefficient as a function of the drawn channel length. The threshold voltages corresponding to four different APT region implant conditions are illustrated in these figures—(i) single implant APT region formed by implanting Sb at 160 keV using a dose of $0.9 \times 10^{13}$ atoms/cm$^2$, (ii) single implant APT region formed by implanting Sb at 130 keV using a dose of $0.9 \times 10^{13}$ atoms/cm$^2$, (iii) single implant APT region formed by implanting Sb at 130 keV using a dose of $1.2 \times 10^{13}$ atoms/cm$^2$, and (iv) dual APT regions formed by a first implant of Sb at 130 keV using a dose of $0.6 \times 10^{13}$ atoms/cm$^2$ and a second implant of Sb at 80 keV using a dose of $1.2 \times 10^{13}$ atoms/cm$^2$. It is noted from FIGS. 12A-12C that the lowest Vt roll-off is obtained for the dual APT regions. FIGS. 12A-12C show that dual APT regions can result in lower threshold voltage roll-off (Vt roll off).

Figure 13:
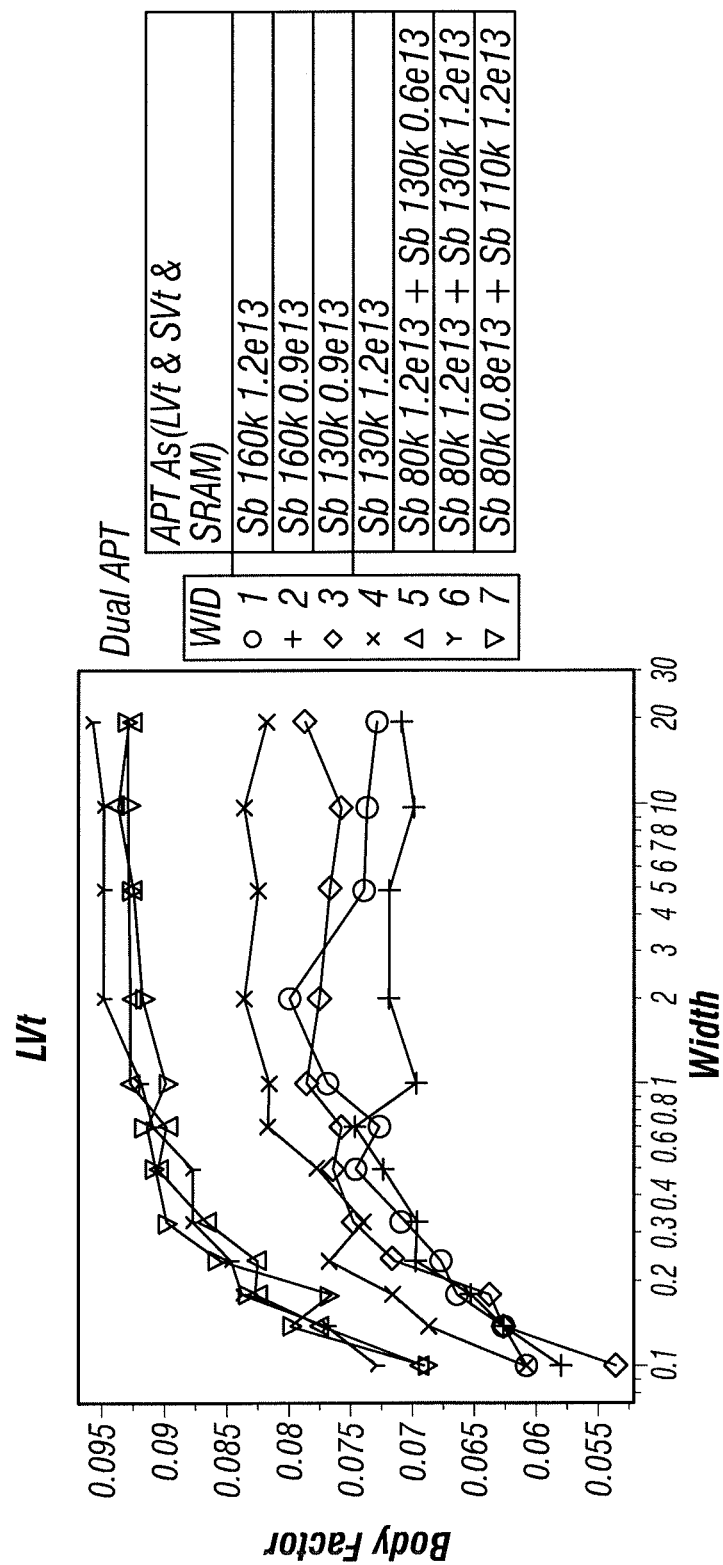
FIG. 13 illustrates the body coefficient for PMOS LVt transistors having single and dual Sb APT regions.

FIG. 13 illustrates the body coefficient for PMOS LVt transistors having single and dual Sb APT regions. It is noted that the PMOS transistors having dual APT regions have a higher body coefficient at a body bias voltage of −0.3 V (labeled Body Factor) as compared to the PMOS transistors having a single implant APT region.

Figure 14:
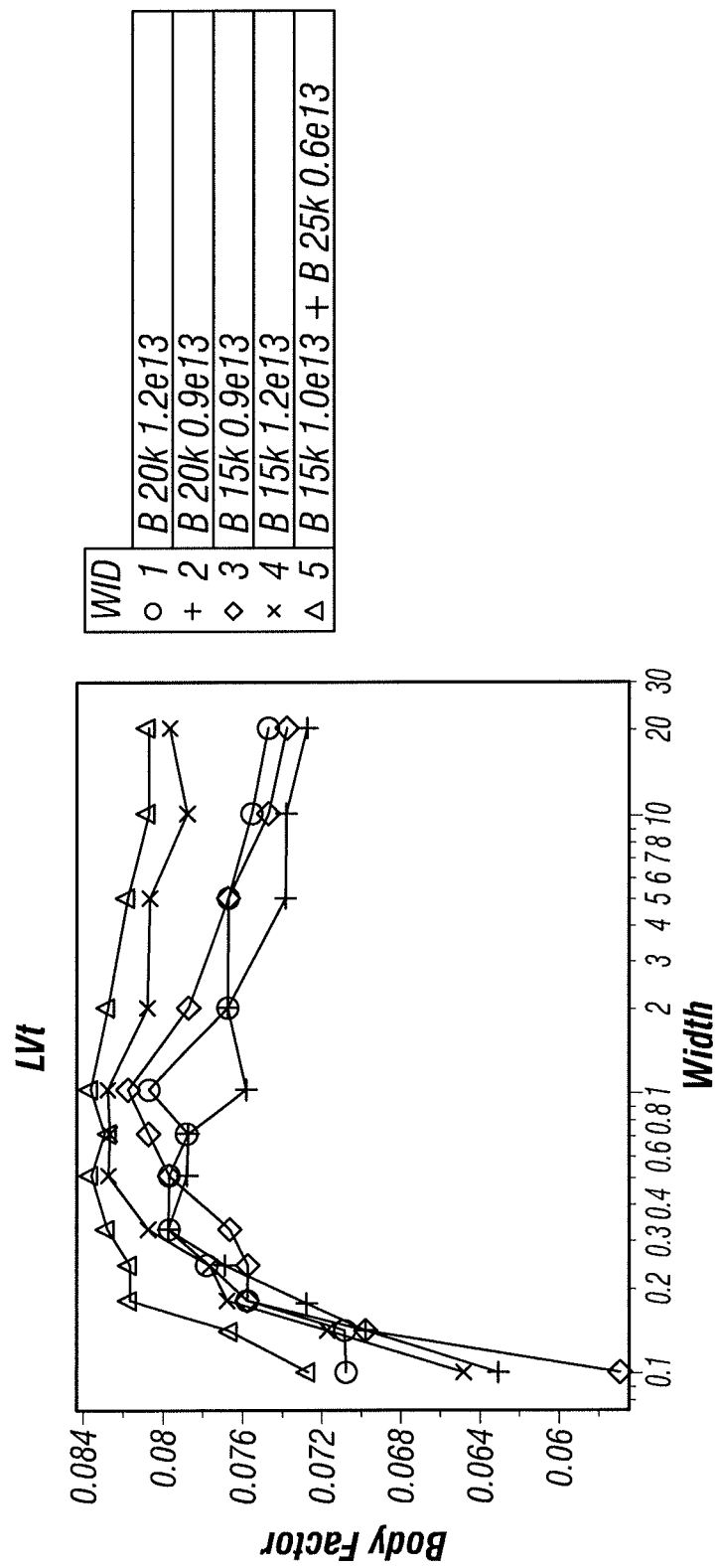
FIG. 14 illustrates the body coefficient for NMOS LVt transistors having single and dual boron (B) APT regions.

FIG. 14 illustrates the body coefficient for NMOS LVt transistors having single and dual boron (B) APT regions. It is noted that the NMOS transistors having dual APT regions have a higher body coefficient at a body bias voltage of 0.3 V (labeled Body Factor) as compared to the NMOS transistors having a single implant APT region.

Figure 15A:
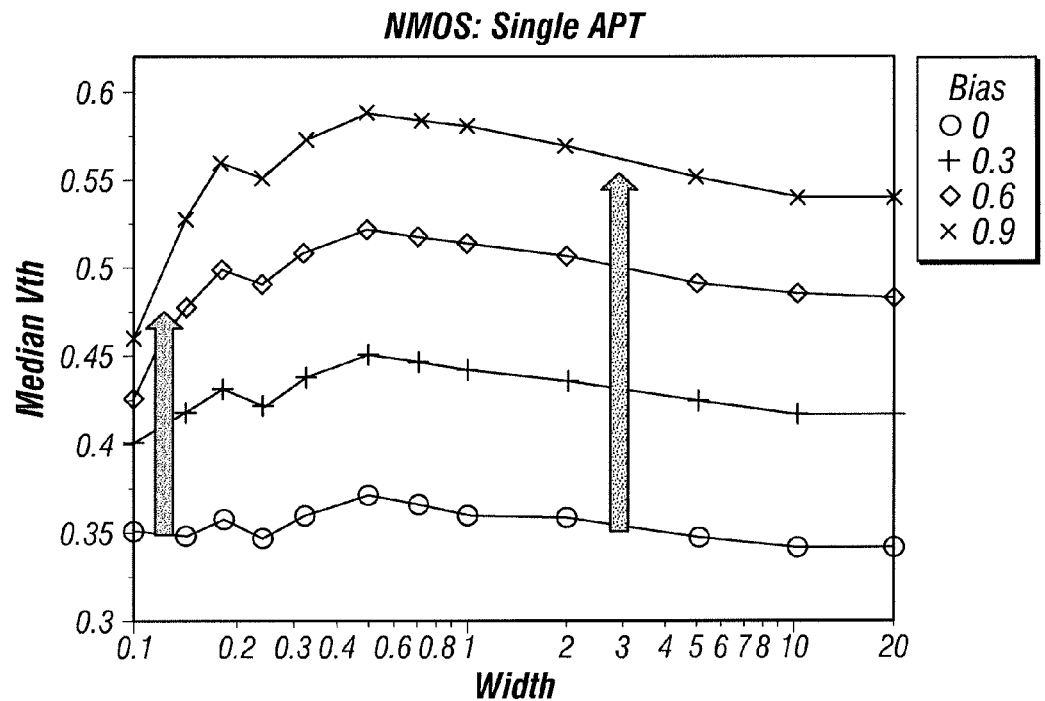
FIGS. 15A-15B illustrate that dual APT regions have an effect on body coefficient for PMOS DDC transistor devices for given screening region conditions.
Figure 15B:
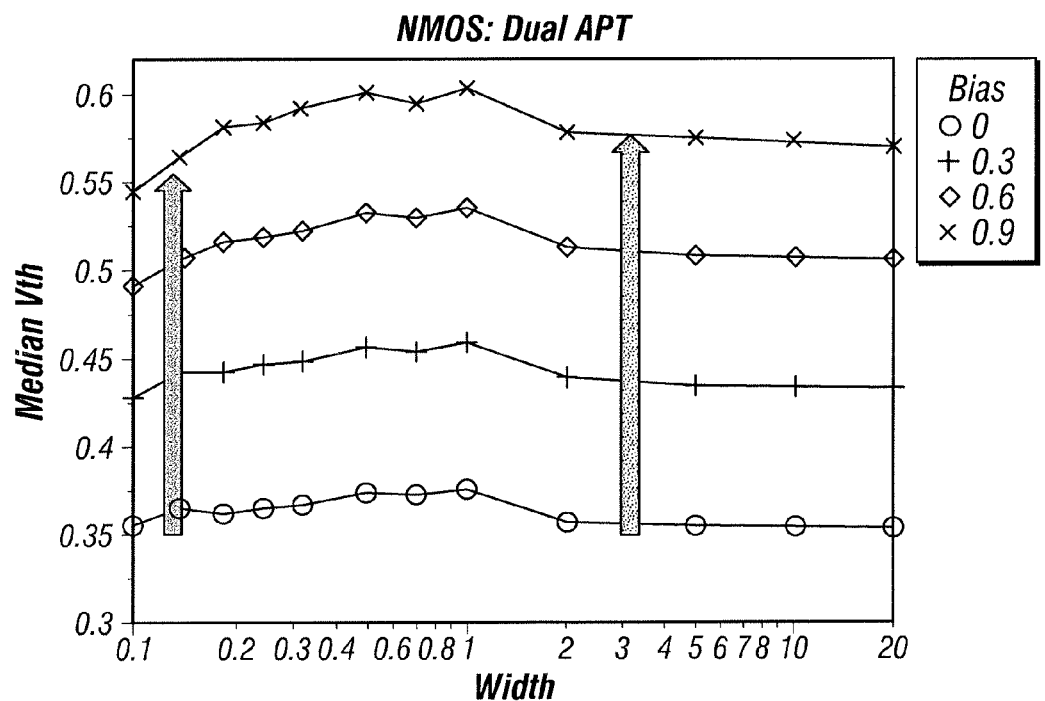

FIGS. 15A and 15B illustrate that dual APT regions have an effect on body coefficient for NMOS DDC transistor devices for given screening region conditions.

FIGS. 15A and 15B illustrate the median threshold voltage for NMOS transistors of various widths as a function of four different applied body bias voltages—0 volts, 0.3 volts, 0.6 volts, and 0.9 volts. It is noted that for all channel widths, the NMOS transistors having dual APT regions have a higher body coefficient compared to NMOS transistors with single APT regions as indicated by the threshold voltage response for varying applied body bias voltage. In addition, the threshold voltage of dual APT NMOS transistors varies less in response to the applied body bias voltage for smaller channel widths, indicating an improved narrow-Z effect in the DDC devices having the dual APT regions.

Figure 16A:
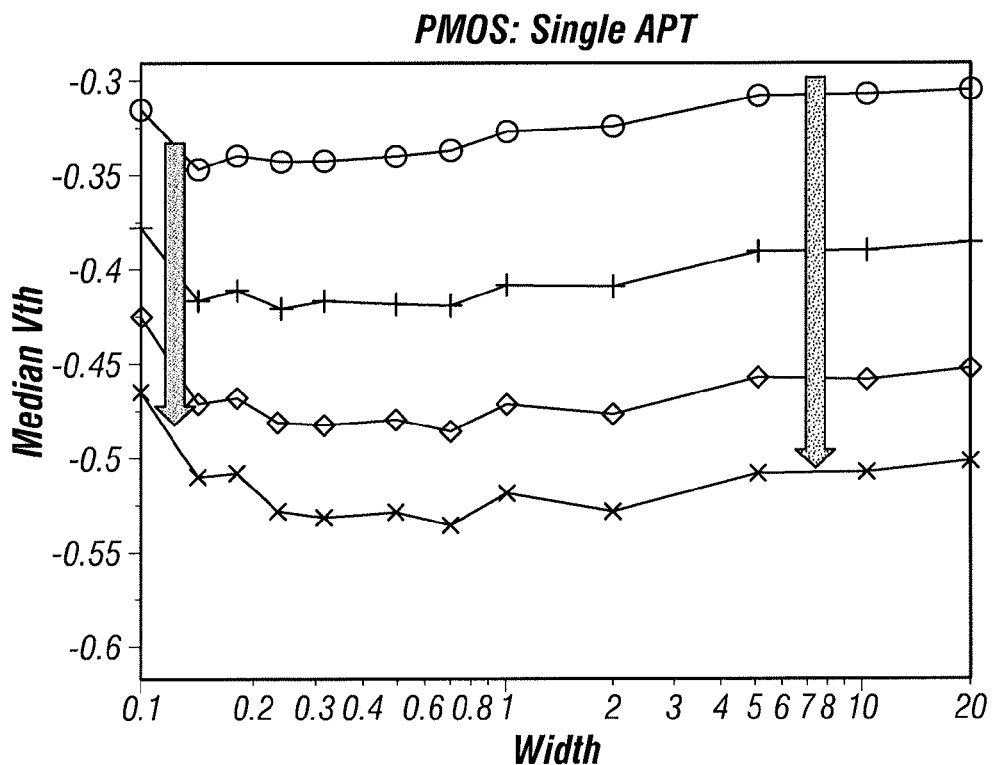
FIGS. 16A and 16B illustrate that dual APT regions can provide an enhanced body coefficient for NMOS transistor devices for given screening region conditions.
Figure 16B:
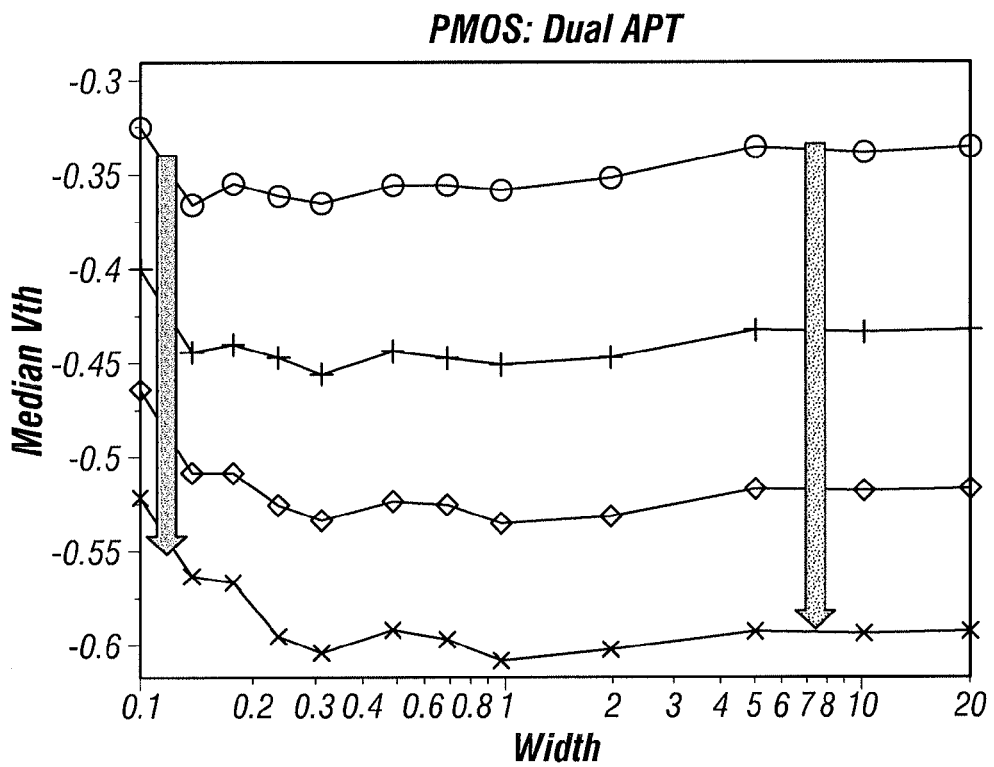

FIGS. 16A and 16B illustrate that dual APT regions can provide an enhanced body coefficient for PMOS transistor devices for given screening region conditions. FIGS. 16A and 16B illustrate the median threshold voltage for PMOS transistors of various widths as a function of four different applied body bias voltages—0 volts, 0.3 volts, 0.6 volts, and 0.9 volts. It is noted that for all channel widths the PMOS transistors having dual APT regions have a higher body coefficient compared to PMOS transistors with single APT regions as indicated by the threshold voltage response for varying applied body bias voltage. In addition, the threshold voltage of dual APT PMOS transistors varies less in response to the applied body bias voltage for smaller channel widths, indicating an improved narrow-Z effect in the DDC devices having the dual APT regions.

In one embodiment, a target LVt transistor device type having a target threshold voltage of 0.38 V can be achieved using screening region implant dose of $5 \times 10^{12}$ atoms/cm$^2$ for a transistor using dual APT regions (where the dual APT regions are formed with a first Sb implant at 80 keV using a dose of $1.2 \times 10^{13}$ atoms/cm$^2$ and a second Sb implant at 130 keV using a dose of $1.2 \times 10^{13}$ atoms/cm$^2$) as compared to a higher screening region dose of $8 \times 10^{12}$ atoms/cm$^2$ for a transistor using a single APT region (where the single APT region is formed with an Sb implant at 130 keV using a dose of $1.2 \times 10^{13}$ atoms/cm$^2$). In addition, the body factor of the dual APT LVt transistor is higher compared to that of the single APT LVt transistor, 85 as compared to 60 respectively, where the body factor is measured at a body bias voltage of −0.3 V. In an alternative embodiment, a target SVt transistor device type having a target threshold voltage of 0.46 V can be achieved using a screening region implant dose of $1.2 \times 10^{13}$ atoms/cm$^2$ for a transistor using dual APT regions (where the dual APT regions are formed with a first Sb implant at 80 keV using a dose of $1.2 \times 10^{13}$ atoms/cm$^2$ and a second Sb implant at 130 keV using a dose of $1.2 \times 10^{13}$ atoms/cm$^2$) as compared to a higher screening region dose of $1.4 \times 10^{13}$ atoms/cm$^2$ for a transistor using a single APT region (where the single APT region is formed with an Sb implant at 130 keV using a dose of $1.2 \times 10^{13}$ atoms/cm$^2$). The body factor of the dual APT SVt transistor is also higher compared to that of the single APT SVt transistor, 96 as compared to 85 respectively, where the body factor is measured at a body bias voltage of −0.3 V.

Transistors created according to the foregoing embodiments, structures, and processes can be formed on the die alone or in combination with other transistor types. Transistors formed according to the disclosed structures and processes can have a reduced mismatch arising from scattered or random dopant variations as compared to conventional MOS analog or digital transistors. This is particularly important for transistor circuits that rely on closely matched transistors for optimal operation, including differential matching circuits, analog amplifying circuits, and many digital circuits in widespread use such as SRAM cells.

Variation can be even further reduced by adoption of structures such as a screening region, an undoped channel, or a threshold voltage set region as described herein to further effectively increase headroom which the devices have to operate. This allows high-bandwidth electronic devices with improved sensitivity and performance.

In summary, a dual-screen DDC transistor is disclosed. There is provided a transistor device having a gate, a doped source and drain region on either side of the gate and embedded in the substrate, for which the substrate comprises a substantially undoped epitaxial layer (prior to the formation of the source and drain regions), a first heavily doped region doped with dopants of opposite polarity as the source and drain dopants, the first heavily doped region recessed a vertical distance down from the bottom of the gate at a depth of 1/1.5 to 1/5 times the gate length, and a second heavily doped region adjacent to the first heavily doped region, wherein the second heavily doped region is also of the opposite polarity as the source and drain dopants, the second heavily doped region which may have a higher or lower concentration of dopants than the first heavily doped region and may abut the first heavily doped region. In addition, there may be one or more separately doped regions also of the opposite polarity as the source and drain dopants to serve as anti-punch through. Variations in the location, number of regions, and dopant concentrations allow for a substrate to include multiple transistors with differing threshold voltages.

Although the present disclosure has been described in detail with reference to a particular embodiment, it should be understood that various other changes, substitutions, and alterations may be made hereto without departing from the spirit and scope of the structures and methods disclosed herein. Numerous other changes, substitutions, variations, alterations, and modifications may be ascertained by those skilled in the art and it is intended that the present disclosure encompass all such changes, substitutions, variations, alterations, and modifications as falling within the spirit and scope of the structures and methods disclosed herein. Moreover, the present disclosure is not intended to be limited in any way by any statement in the specification.

What is claimed is:

1. A method of fabricating a semiconductor structure, comprising:
   concurrently implanting in a substrate a first screening region for each of first, second, and third transistor elements;
   implanting in the substrate a second screening region above the first screening region for the second transistor element;
   implanting in the substrate a third screening region above the first screening region for the third transistor element;
   forming a substantially undoped epitaxial layer covering the first, second, and third screening regions to form a channel layer for each of first, second, and third transistor elements,
   wherein the first screening region is in contact with at least one of the second and third screening regions.

2. The method of claim 1, wherein the first screening region is separated from at least one of the second and third screening regions.

3. The method of claim 1, wherein a dopant concentration of the first screening region is higher than each of a dopant concentration of the second screening region and a dopant concentration of the third screening region different from the dopant concentration of the second screening region.

4. The method of claim 1, wherein the third screening region is implanted at a lesser depth than the second screening region.

5. The method of claim 1, wherein:
   the channel layer on the substrate for each of the first, second, and third transistor elements is formed by a blanket epitaxial growth.

6. The method of claim 1, further comprising:
   concurrently implanting a first antipunchthrough region for each of the first, second, and third transistor elements;
   concurrently implanting a second antipunchthrough region above the first antipunchthrough region for each of the first, second, and third transistor elements;
   wherein the first and second antipunchthrough regions underlie the respective screening regions of the first, second, and third transistor elements.

7. The method of claim 6, wherein the first antipunchthrough region is formed in contact with the second antipunchthrough region.

8. The method of claim 6, wherein the second antipunchthrough region is formed in contact with the first screening region.

9. The method of claim 1, wherein each of the transistor elements has a gate with a source and a drain on either side of the gate, each of the first and second screening regions extends laterally across the length of the channel and abuts the source and drain.

10. The method of claim 9, wherein each of the first and second screening regions is located to be below the surface of the substrate at a distance of at least less than 1/1.5 times a length of the gate and above the bottom of the source and drain to which each of the screening regions abuts.

* * * * *